(12) United States Patent
Lai et al.

(10) Patent No.: US 12,266,594 B2
(45) Date of Patent: Apr. 1, 2025

(54) METHOD OF MAKING SEMICONDUCTOR DEVICE HAVING SELF-ALIGNED INTERCONNECT STRUCTURE

(71) Applicant: TAIWAN SEMICONDUCTOR MANUFACTURING COMPANY, LTD., Hsinchu (TW)

(72) Inventors: Chih-Yu Lai, Hsinchu (TW);
Chih-Liang Chen, Hsinchu (TW);
Chi-Yu Lu, Hsinchu (TW);
Shang-Syuan Ciou, Hsinchu (TW);
Hui-Zhong Zhuang, Hsinchu (TW);
Ching-Wei Tsai, Hsinchu (TW);
Shang-Wen Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/517,298

(22) Filed: Nov. 22, 2023

(65) Prior Publication Data

US 2024/0096756 A1 Mar. 21, 2024

Related U.S. Application Data

(62) Division of application No. 17/231,527, filed on Apr. 15, 2021, now Pat. No. 11,854,940.

(51) Int. Cl.
*H01L 23/48* (2006.01)
*H01L 21/768* (2006.01)

(52) U.S. Cl.
CPC ...... *H01L 23/481* (2013.01); *H01L 21/76897* (2013.01); *H01L 21/76898* (2013.01)

(58) Field of Classification Search
CPC ..... H01L 23/48; H01L 23/481; H01L 23/528; H01L 23/535; H01L 23/5286; H01L 29/66; H01L 29/6659; H01L 29/66515; H01L 29/06; H01L 29/423; H01L 29/66575; H01L 29/775; H01L 29/786; H01L 29/0673; H01L 29/78696; H01L 29/42392; H01L 27/06; H01L 27/088;
(Continued)

(56) References Cited

U.S. PATENT DOCUMENTS 7,260,442 B2   8/2007   Hwang et al.
9,256,709 B2   2/2016   Yu et al.
(Continued)

*Primary Examiner* — Chuong A Luu
(74) *Attorney, Agent, or Firm* — Hauptman Ham, LLP

(57) ABSTRACT

A method of making a semiconductor device includes manufacturing a first transistor over a first side of a substrate. The method further includes depositing a spacer material against a sidewall of the first transistor. The method further includes recessing the spacer material to expose a first portion of the sidewall of the first transistor. The method further includes manufacturing a first electrical connection to the transistor, a first portion of the electrical connection contacts a surface of the first transistor farthest from the substrate, and a second portion of the electrical connect contacts the first portion of the sidewall of the first transistor. The method further includes manufacturing a self-aligned interconnect structure (SIS) extending along the spacer material, wherein the spacer material separates a portion of the SIS from the first transistor, and the first electrical connection directly contacts the SIS.

20 Claims, 30 Drawing Sheets

(58) Field of Classification Search
CPC ............. H01L 27/0688; H01L 27/0694; H01L 27/0886; H01L 21/822; H01L 21/8221; H01L 21/8234; H01L 21/823431; H01L 21/823475; H01L 21/76895; H01L 21/768; H01L 21/76897; H01L 21/76898
USPC .................................................. 438/629, 637
See application file for complete search history.

(56) References Cited

U.S. PATENT DOCUMENTS

| | | | |
|---|---|---|---|
| 2005/0127408 A1* | 6/2005 | Doris | ................. H01L 27/1203 |
| | | | 438/303 |
| 2007/0290206 A1 | 12/2007 | Ahn et al. | |
| 2008/0054392 A1 | 3/2008 | Toomey | |
| 2011/0090731 A1* | 4/2011 | Chi | ......................... G11C 11/22 |
| | | | 257/E27.111 |
| 2014/0040838 A1 | 2/2014 | Liu et al. | |
| 2015/0102400 A1* | 4/2015 | Chen | ................. H01L 29/66833 |
| | | | 438/694 |
| 2015/0278429 A1 | 10/2015 | Chang | |
| 2019/0123162 A1 | 4/2019 | Xie et al. | |
| 2021/0257470 A1 | 8/2021 | Bae et al. | |

* cited by examiner

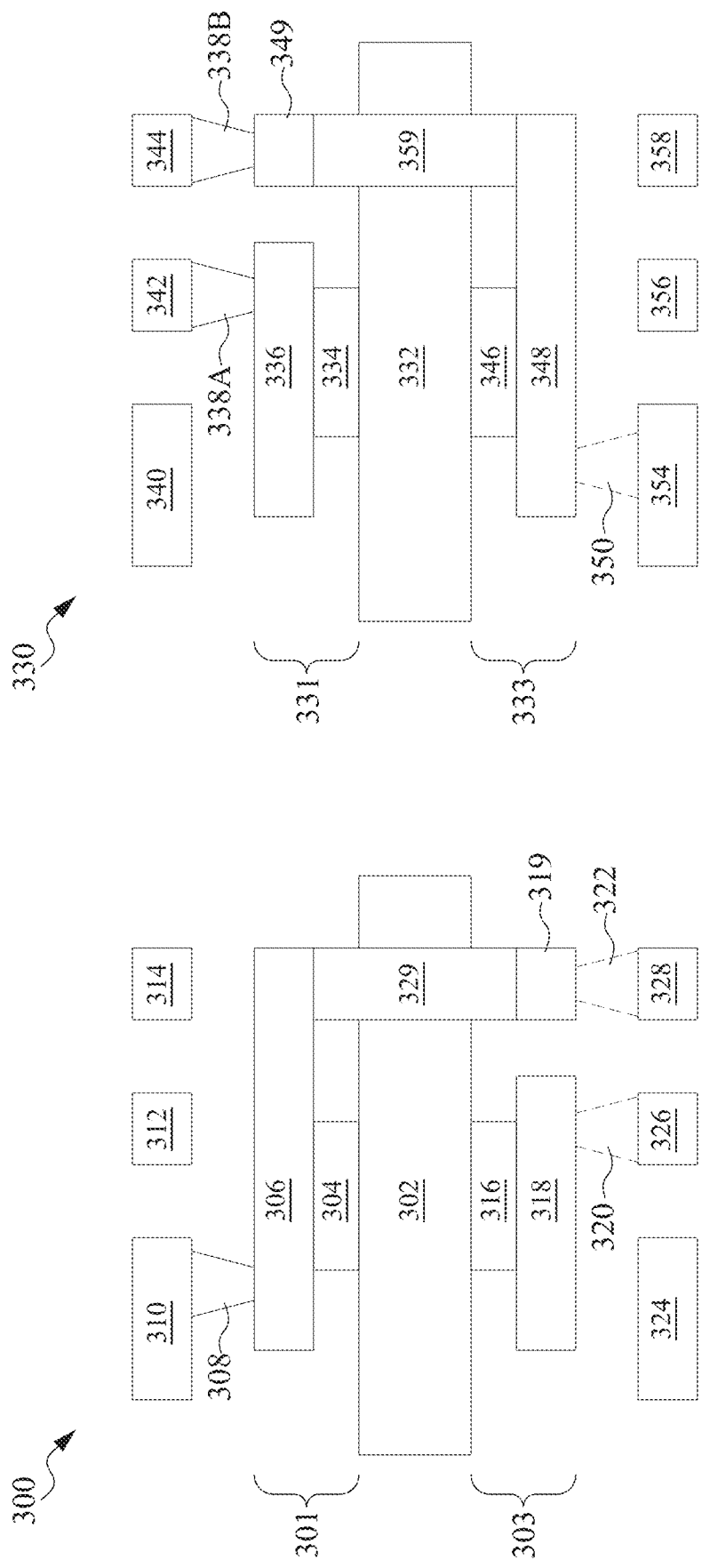

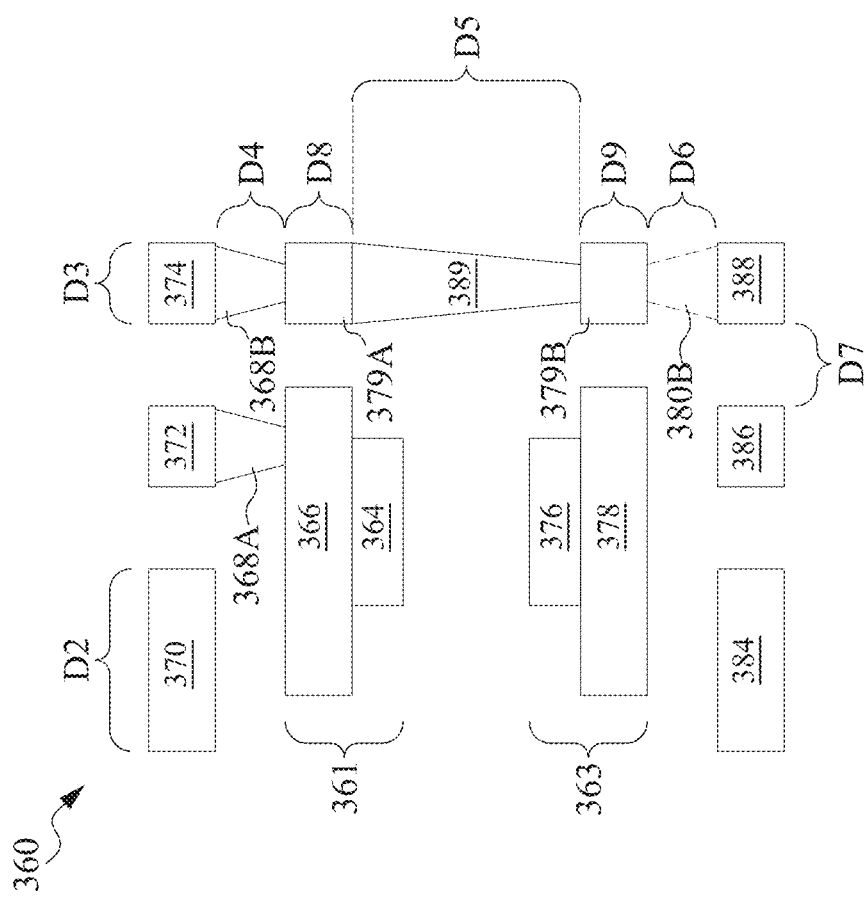

METHOD OF MAKING SEMICONDUCTOR DEVICE HAVING SELF-ALIGNED INTERCONNECT STRUCTURE

PRIORITY CLAIM

This application is a divisional of U.S. patent application Ser. No. 17/231,527, filed Apr. 15, 2021, the entire contents of which are incorporated by reference herein.

BACKGROUND

Interconnect structures in semiconductor devices direct power and signals to and from transistors and other circuit elements. Reductions in transistor area lead to increased crowding in interconnect structures. Parasitic capacitance in semiconductor devices is associated with conductive lines near one another in an interconnect structure and negatively impacts device performance. Resistance for interconnect structures increases with each interface between a conductive line and a via or contact of the interconnect structure. Increases in resistance increase power consumption and delay signal and power transfer. Longer runs of conductive lines in an interconnect structure, and greater numbers of vertical connections in the interconnect structure, are associated with slower switching speed of transistors in semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3D are cross-sectional views of semiconductor devices, in accordance with some embodiments.

DETAILED DESCRIPTION

Figure 1:
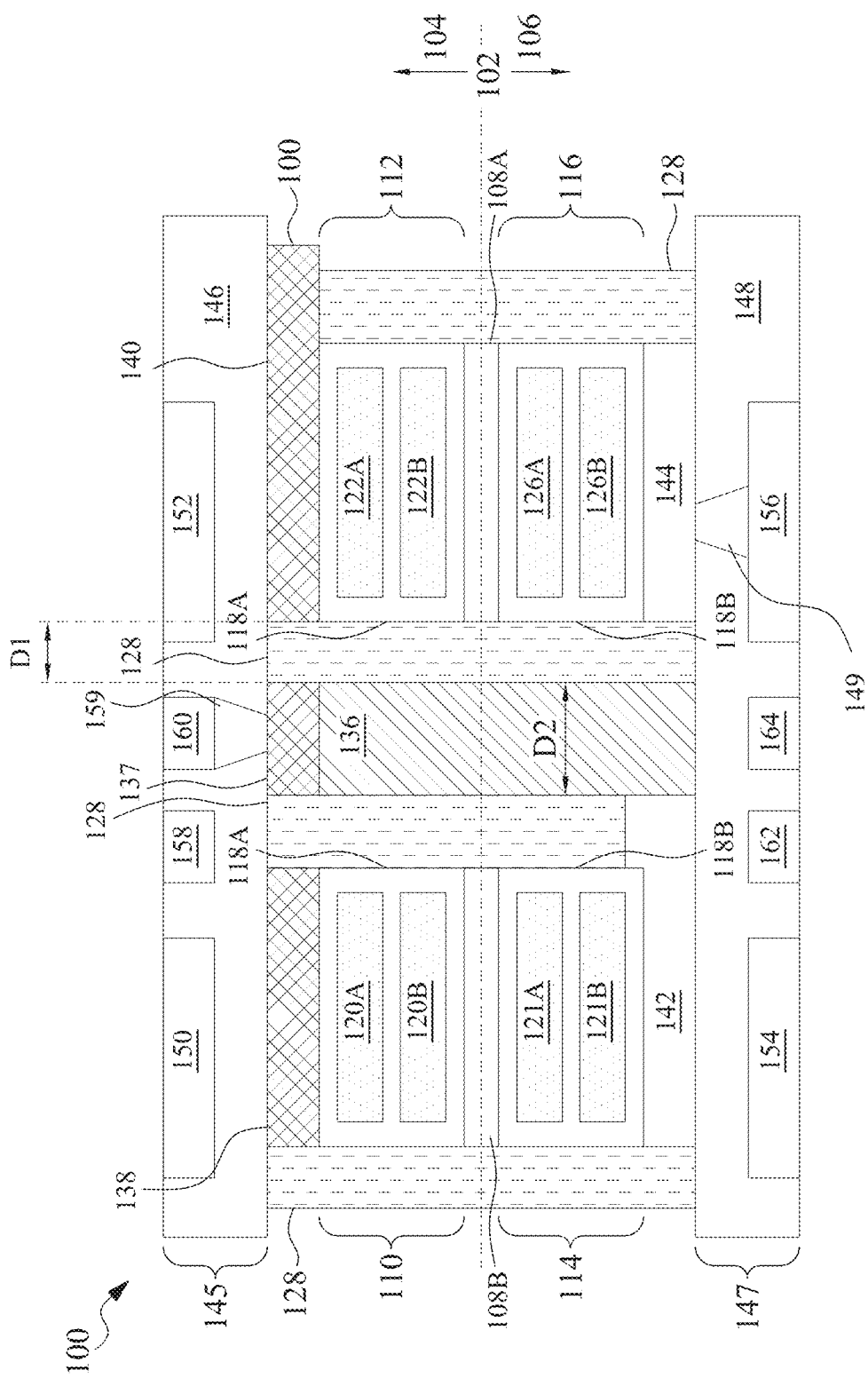
FIG. 1 is a cross-sectional view of a semiconductor device, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As sequential generations of semiconductor devices are manufactured, the increasing transistor density of the devices uses increasingly complex interconnect structure layouts in order to route power and signals to and from transistors and other circuit elements. By reducing the length of conductive lines which link transistors in an interconnect structure, or, in some instances, by eliminating some conductive lines entirely, the interconnect structure complexity is reduced and transistor density has additional opportunity to increase. The increased transistor density helps with further shrinking die areas and reducing manufacturing costs. Further, power pulldown cells, which link power rails at one side of a substrate to power rails at the opposite side of the substrate, die area and manufacturing costs have further margin to shrink.

In some semiconductor devices, interconnections through or across a substrate which has transistors on both a front side and a back side of the substrate include vias which are manufactured by etching from one side of the substrate to electrically connect to a transistor or other circuit element at the opposite side. In some instances, the front side of the substrate is called a top side; and a back side of the substrate is called a bottom side. Thus, top-to-bottom vias (VTB) and bottom-to-top vias (VBT) are located at different locations of the semiconductor device, and are manufactured using different manufacturing flows to perform the photolithography, plasma etch, deposition, and planarization steps associated with manufacturing a via or contact, one set for top-to-bottom vias, and a second set for bottom-to-top vias. Each repetition of the patterning, plasma etch, deposition, and planarization steps to manufacture VTB and VBT provides additional opportunities for manufacturing errors or defects in the manufacturing flow, increasing the frequency and likelihood of device deviations from a performance standard and/or non-functional semiconductor devices.

A self-aligned interconnect structure (SIS) and a method of making the self-aligned interconnect structure allows for the manufacture of semiconductor devices using a single manufacturing flow to manufacture the SIS, whether from the substrate top side or the substrate bottom side. Further, the SIS manufacturing flow described herein is suitable for manufacturing SIS for semiconductor devices having a single layer of transistors on one side of a substrate, or multiple layers of transistors at opposite sides of a substrate. The reduced manufacturing complexity associated with SIS manufacture increases the likelihood of semiconductor devices meeting a performance standard and reduces the likelihood of non-functional semiconductor devices.

For purposes of the present disclosure, the terms "top" and "bottom" are used to indicate the orientation of the semiconductor device, with respect to a reference line (see reference line 102) below a first set of transistors. During manufacturing, the "top" surface is the surface which is positioned to be modified during a manufacturing process operation, and the "bottom" surface is the surface which is oriented away from the active process space in a manufacturing tool. For the semiconductor device, after manufacturing, the term "top" is used to refer to the side of the semiconductor substrate (e.g., the wafer) having the interconnect structure with the largest number of layers. For clarity, the drawings include the first layer of a top and a bottom interconnect structure and other layers of interconnect structure at the top and bottom of the wafer are omitted.

FIG. 1 is a cross-sectional view of a semiconductor device 100, in accordance with some embodiments. In semiconductor device 100, a reference line 102 extends through a substrate between transistors of the device. A transistor 110 and a transistor 112 are on a top side of the substrate in a first direction 104 from the reference line 102, and transistors 114 and 116 are on a bottom side of the substrate in a second direction 106 from the reference line 102. The cross-sectional view of semiconductor device 100 extends through a source or drain region of the transistors 110, 112, 114, and 116. Transistor 110 includes channel bars 120A and 120B. Transistor 112 includes channel bars 122A and 122B. Transistor 114 includes channel bars 124A and 124B. Transistor 116 includes channel bars 126A and 126B. A channel bar is a portion of the transistor which includes the source region, the drain region, and a channel region between the source region and the drain region. A channel bar is well suited for gate all around (GAA) transistors. In some embodiments, the channel bar is a monolithic portion of semiconductor material, and a gate dielectric layer extends around a circumference of the channel region of the channel bar. In some embodiments, the channel bar is a nanosheet structure, wherein alternating layers of semiconductor material extend from the source region to the drain region, and, in the channel region, sacrificial semiconductor material has been removed to increase the surface area of the gate dielectric layer and the gate electrode in proximity to the channel region. The alternating layers of sacrificial semiconductor material which remain in the source region and the drain region of a GAA transistor are electrically connected, with the layers of channel semiconductor material, to the source/drain contacts which extend partly or completely around the nanosheet structure. Source/drain contacts which extend completely around the nanosheet structure, or which are against 2-4 of the sides of the nanosheet structure, are understood to have decreased contact resistance and faster switching speeds than transistors wherein the source/drain contacts contact just one side of the nanosheet structure. Transistors 110 and 112 have source/drain contact material 118A extending around channel bars 120A and 120B, and around channel bars 122A and 122B. Transistors 114 and 116 have source/drain contact material 118B extending around channel bars 124A and 124B, and around channel bars 126A and 126B. In some embodiments, a transistor has a single channel bar. In some embodiments, a transistor has multiple channel bars.

The substrate between transistor 110 and transistor 114, and between transistor 112 and transistor 116, has been trimmed by an etch process into substrate segments. Substrate segment 108B is between transistors 110 and 114. Substrate segment 108A is between transistors 112 and 116.

Spacer material 128 is at the sides of transistors 110, 112, 114, and 116, and against the edges of substrate segments 108A and 108B where the substrate segments are not oriented toward a transistor. According to some embodiments, a transistor stack includes a pair of transistors on opposite sides of a substrate segment by connecting gate structures and source/drain regions. For example, transistor 110 and transistor 114 at opposite sides of substrate segment 108B is able to form a first transistor stack; and transistor 112 and transistor 116 on opposite sides of substrate segment 108A is able to form a second transistor stack.

An electrical connection 138, usable as a source/drain contact, is along a top surface of the transistor 110 in the first direction 104. An electrical connection 140, usable as a source/drain contact, is along a top surface a top surface of the transistor 112 in the first direction 104. An electrical connection 142, usable as a source/drain contact, is along a bottom surface of the transistor 114 in the second direction 106. An electrical connection 144, usable as a source/drain contact, is along a bottom surface of the transistor 116 in the second direction 106.

Self-aligned interconnect structure (SIS) 136 is located between the spacer material 128 between transistor 110 and transistor 114, and between transistor 112 and transistor 116. In semiconductor device 100, SIS 136 has approximately a same dimension D2 between the spacer material 128 against transistors 110 and 114, and spacer material 128 against transistors 112 and 116 along an entire portion of SIS 136 from layer of interconnect structure 147 to electrical connection 137 (against layer of interconnect structure 145). SIS 136 is manufactured by [1] performing a selective etch process (e.g., a selective liquid etch process) to remove dielectric material between the portions of spacer material 128 against the transistors, and [2] filling the space between the portions of spacer material 128 with [a] a conductive material or [2] a doped semiconductor material. In some embodiments, SIS 136 includes one or more of tungsten (W), titanium (Ti), tantalum (Ta), cobalt (Co), nickel (Ni), copper (Cu), platinum (Pt), palladium (Pd), or alloys thereof, or other conductive materials suitable for a front end of line (FEOL) contact structure. In some embodiments, a liner material is also formed in the opening prior to performing a metal fill process to add conductive material for the SIS 136. In some embodiments, the liner includes one or more of, e.g., cobalt, titanium nitride (TiN), tantalum nitride (TaN), or some other FEOL liner compatible with a GAA transistor.

A layer of interconnect structure 145 is over the top surfaces of spacer material 128 at the sidewalls of transistors 110 and 112. Layer of interconnect structure 145 includes a dielectric material 146 and a contact 159 electrically connected to electrical connection 137. Layer of interconnect structure 145 also includes a power rail 150, a power rail 152, a conductive line 158, and a conductive line 160.

A layer of interconnect structure 147 is against the bottom surface substrate material 128 and the bottom surfaces of electrical connection 142, electrical connection 144, and SIS 136. Layer of interconnect structure 147 includes a dielectric material 148 and a contact 149 electrically connected to electrical connection 144 at the bottom of transistor 116. Layer of interconnect structure 147 also includes a power rail 154, a power rail 146, and conductive lines 162 and 164.

Electrical connection 142 provides a horizontal pathway for current to flow from transistor 114 to SIS 136 by connecting to [1] the side of transistor 114 distal from the substrate segment 108B, the side of transistor 114 exposed after recessing spacer material 128 between transistor 114 and SIS 136, and electrically connecting to a portion of a sidewall of SIS 136 adjacent to layer of interconnect structure 147. The horizontal current pathway between transistor 114 and SIS 136, and the vertical current pathway between electrical connection 142 and contact 159, reduces an overall length of conductive lines used to route power or signal from the top side of the substrate to the bottom side of the substrate. As a result, resistance is reduced and an overall size of the semiconductor device 100 is reduced in comparison with structures that do not include SIS 136 and electrical connection 142.

Figure 2A:
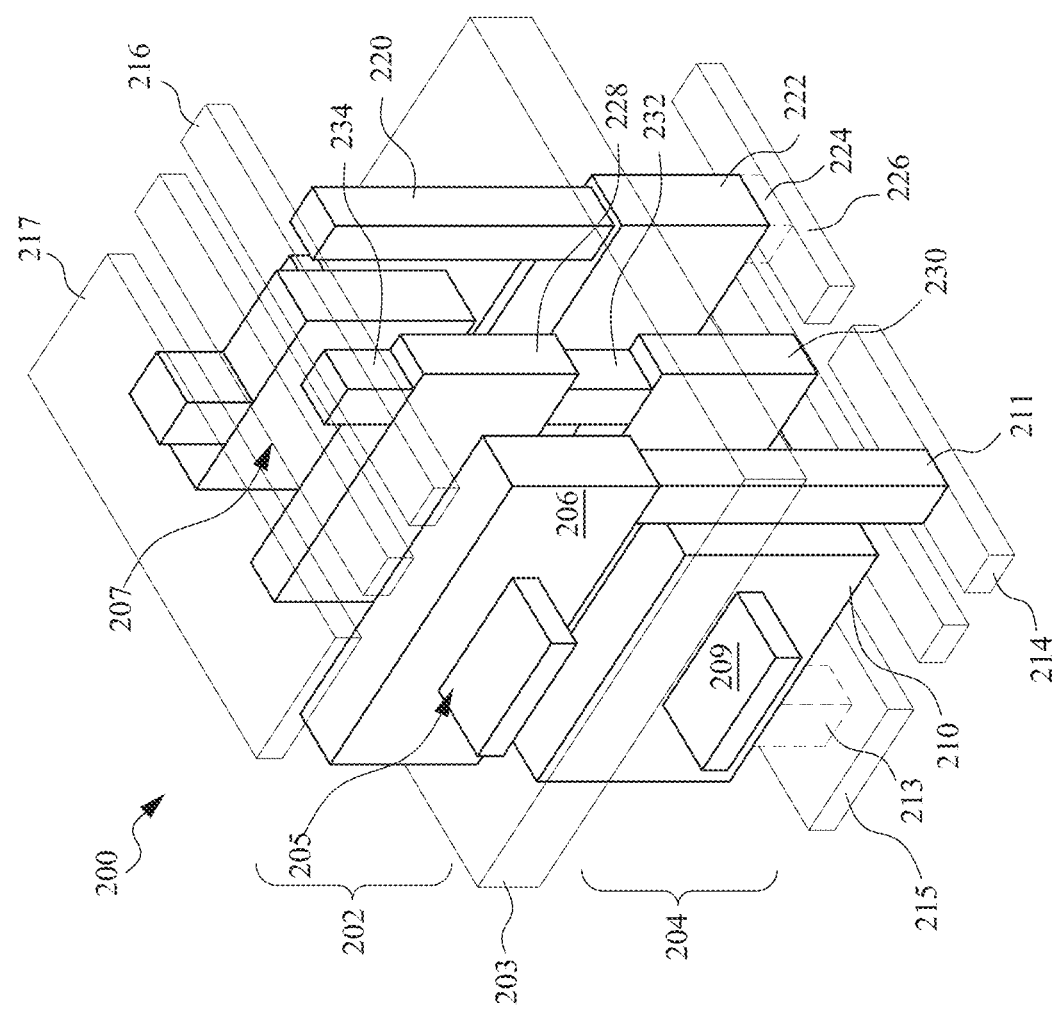
FIGS. 2A-2B are perspective views of semiconductor devices, in accordance with some embodiments.
Figure 2B:
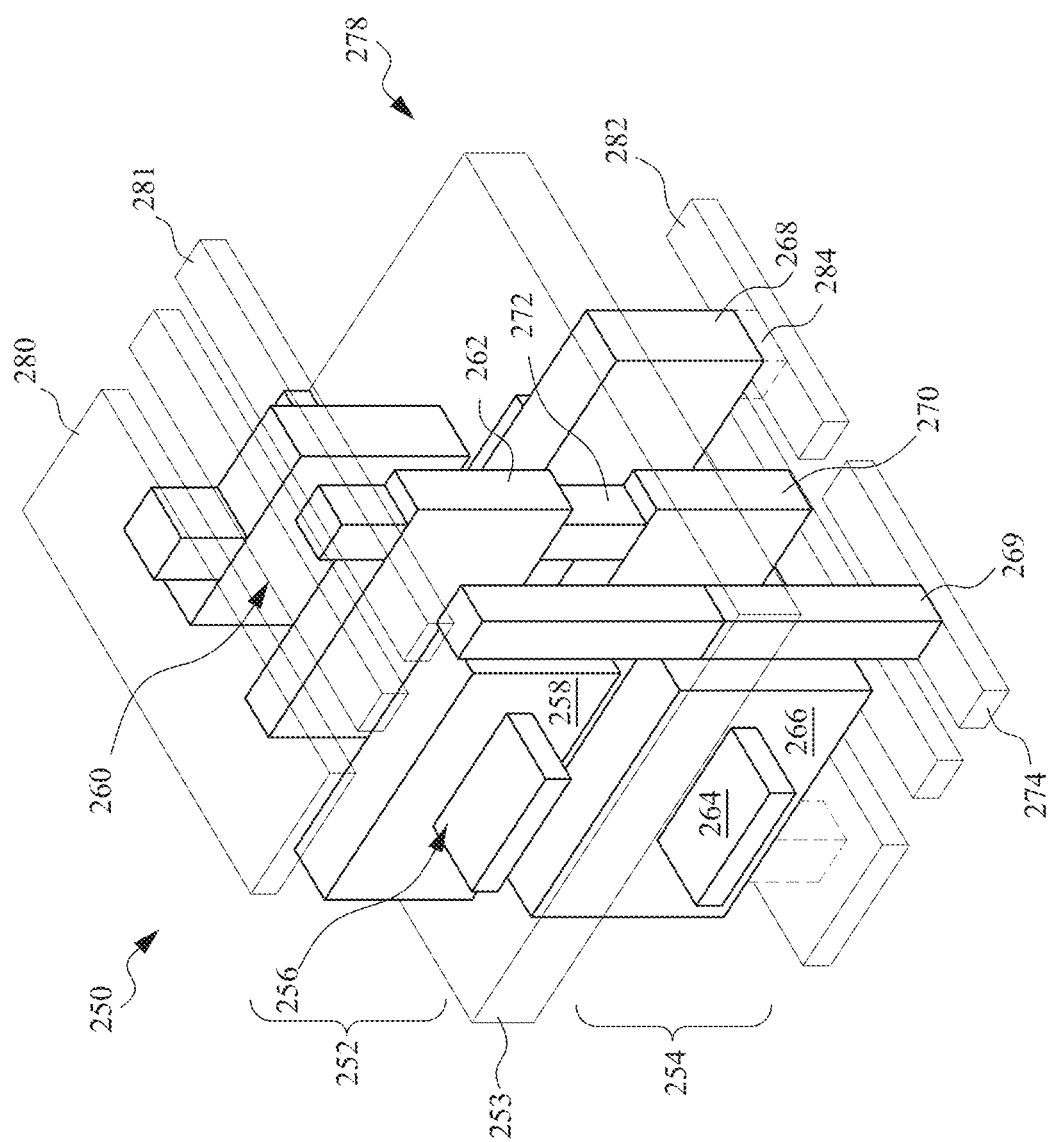

FIGS. 2A-2B are perspective views of semiconductor devices, in accordance with some embodiments. Semiconductor device 200 of FIG. 2A includes both a VTB SIS and a VBT SIS. Semiconductor device 250 of FIG. 2B includes an M0 jump interconnect between two conductive lines of semiconductor device 250.

In FIG. 2A, semiconductor device 200 includes a transistor 202 on a top side of a substrate 203 and a transistor 204 on a second side of the substrate 203. Transistor 202 includes channel bar 205, which extends from source electrode 206 to drain electrode 207. In channel bar 205 there is a source region (not shown) in proximity to source electrode 206, a drain region (not shown) in proximity to drain electrode 207, and a channel region between the source region and the drain region, in proximity to gate electrode 228. In some embodiments, the channel bar 205 is a monolithic structure manufactured of a single layer of material. In some embodiments, the channel bar 205 includes a nanosheet structure having alternating layers of active area semiconductor material and a support material. In some embodiments, the active area semiconductor material includes silicon (Si), silicon germanium (SiGe), gallium arsenide (GaAs), or some other semiconductor material used for transistors. In some embodiments, the support material is silicon, silicon germanium, gallium arsenide, a dielectric material, or some other material which is configured to undergo selective etching with respect to the active area semiconductor material, such that an etch process removes the support material and leaves behind a majority of the active area semiconductor material.

Semiconductor device 200 includes substrate 203 between transistor 202 and transistor 204. Transistor 202 is manufactured at a first, or top, side of the substrate, and transistor 204 is manufactured at a second, or bottom, side of the substrate 203.

In transistor 202, source electrode 206 is wider than the drain electrode 207 in a direction extending from power rail 217 to conductive line 216. In transistor 204, drain electrode 222 is wider, in the direction extending from power rail 217 to conductive line 216, than source electrode 210. The source electrode 206 electrically connects to conductive line 214 using SIS 211. A spacer material (not shown) is between SIS 211 and source electrode 210. The electrical connection between source electrode 206 and conductive line 214 extends through the substrate 203.

In transistor 204, drain electrode 222 electrically connects to conductive line 226 through contact 224. The drain electrode 222 electrically connects to conductive line 216 through SIS 220. In the active area of transistor 202, SIS 220 bypasses drain electrode 207 to electrically connect drain electrode 222 to conductive line 216. The source electrode 210 is electrically connected to power rail 215 by contact 213.

SIS 211 and SIS 220 are single-layer self-aligned structures, which are formed by removing a portion of the substrate 203 and dielectric material (not shown) from a region adjacent to the spacers at the sides of source or drain electrodes, as described above. A conductive material fills the opening to form the electrical connection.

The gate electrode 228 is electrically connected to gate electrode 230 of the transistor 204 by a via 232 extending through the substrate 203. The gate electrode 228 is electrically connected to conductive line 216 by contact 234. One of ordinary skill in the art would recognize that a gate structure for each of transistors 202 and 204 includes a gate dielectric layer in addition to the corresponding gate electrodes 228 and 230. By connecting the gate electrodes 228 and 230 by via 232, conductivity of both transistors 202 and 204 is controllable by a single connection to conductive line 216. This reduces an amount of routing for forming functional devices.

In FIG. 2B, semiconductor device 250 includes a jump interconnect 269 which extends through a substrate 253 and bypasses the active areas of transistors 252 and 254, and the source electrodes 258 and 266.

Transistor 252 is at a first, or top, side of the substrate 253 and transistor 254 is at the bottom side of the substrate 253. Transistor 252 includes a channel bar 256, a source electrode 258, a drain electrode 260, and a gate electrode 262. Transistor 254 includes a channel bar 264, a source electrode 266, and a drain electrode 268 and a gate electrode 270. Gate electrode 270 is electrically connected to gate electrode 262 by via 272 that extends through the substrate 253. Drain electrode 268 is wider, in a direction extending from power rail 280 conductive line 281, than drain electrode 260, source electrode 258, and source electrode 266.

Jump interconnect 269 bypasses both source electrode 258 in transistor 252, and source electrode 266 in transistor 254. Jump interconnect 269 electrically connects conductive line 281 and conductive line 274. Jump interconnect 269 is an SIS. Conductive line 274 is aligned with conductive line 282. Conductive line 282 electrically connects to drain electrode 268 by contact 284. Thus, contact 284 is within the footprint of transistor 254 because contact 284 is vertically aligned with a portion of drain electrode 268.

In some embodiments, jump interconnect 269 includes two SIS. For example, a first SIS is formed on a first side of the substrate 253 and a second SIS is formed on a second side of the substrate 253. One of the first SIS or the second SIS extends through the substrate 253. In some instances, interfaces are noticeable at a junction of the first SIS and the second SIS. In some embodiments, jump interconnect 269 includes a single SIS continuously extending from conductive line 281 to conductive line 274 with no interfaces therein.

One of ordinary skill in the art would recognize that the SIS of FIG. 2A and FIG. 2B are capable of being combined together in a single semiconductor device.

Figure 3C:
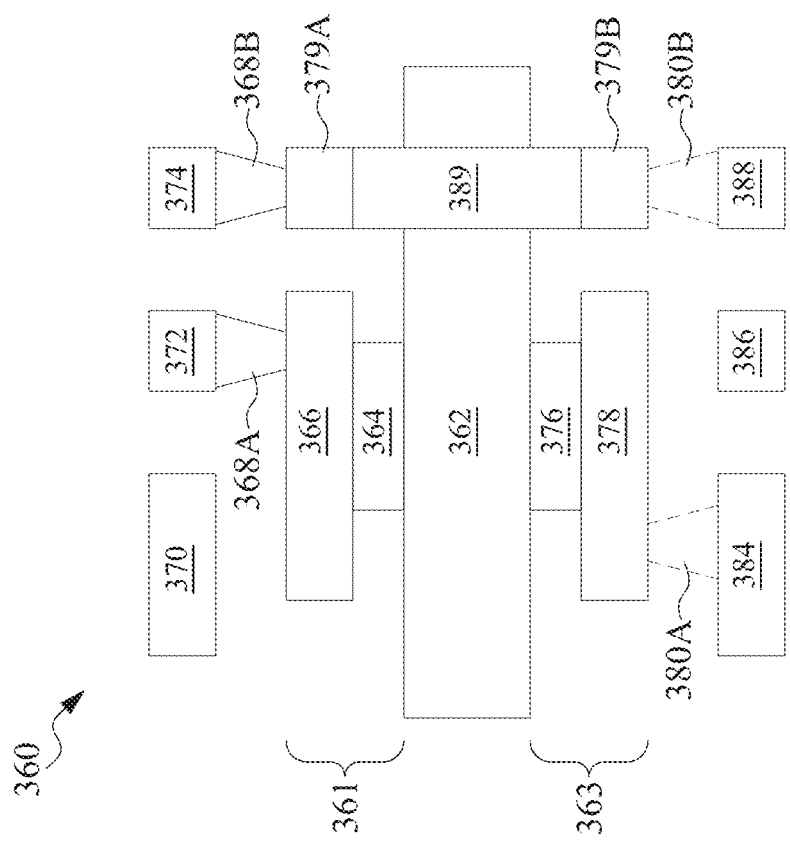

FIGS. 3A-3D are cross-sectional views of semiconductor devices, in accordance with some embodiments. In FIGS. 3A-3C, the substrate is shown between the transistors. The substrate is omitted in FIG. 3D for the sake of clarity. Further, the transistor electrodes (e.g., source electrodes) of semiconductor devices 300, 330, and 360, are shown as "half height" electrodes, which make electrical contact to one side of a channel bar of the transistors. In some embodiments, a "half height" electrode makes electrical contact to 1 full side of the channel bar, and extends part way down the sides of the channel bar in the source region or drain region of the semiconductor device. In some embodiments, the electrodes surround the channel bar as in FIGS. 2A and 2B above.

In FIG. 3A, semiconductor device 300 includes transistor 301 at a first side of substrate 302, and a transistor 303 at a second side of substrate 302. Transistor 301 includes channel bar 304 and source electrode 306. Contact 308 electrically connects power rail 310 to source electrode 306. Conductive lines 312 and 314 extend parallel to power rail 310 above source electrode 306.

In transistor 303, channel bar 316 contacts source electrode 318. Contact 320 electrically connects source electrode 318 to conductive line 326. Power rail 324 and conductive line 328 extend parallel to conductive line 326 below source electrode 318. Conductive line 328 is electrically connected to source electrode 306 in transistor 301 by SIS 329, conductive line segment 319, and contact 322. In some embodiments, the conductive line segment 319 is formed simultaneously with the source electrode 318 and includes a same material as the source electrode 318. In a manufacturing process for a semiconductor device 300, SIS 329 is manufactured between the manufacturing steps for source electrode 308 and source electrode 318. As long as one of source electrode 306 or conductive line segment 319 has not been manufactured, the process flow to manufacture SIS 329 is able to be performed from either the first side of substrate 302 or from the second side of substrate 302.

The SIS 329 includes a single continuous structure having no interfaces therein. In some embodiments, the SIS 329 is formed in multiple deposition steps resulting in at least one noticeable interface. A width of the SIS 329 is substantially uniform along an entire length of the SIS 329. In some embodiments, the SIS 329 has a tapered profile. A direction of tapering for a tapered profile will depend on which side of the substrate 302 is processed in order to form the SIS 329. In some embodiments, where the first side of the substrate 302 is processed, a width of the SIS 329 adjacent to source electrode 306 is wider than the SIS 329 adjacent to the conductive line segment 319. In some embodiments, where the second side of the substrate 302 is processed, a width of the SIS 329 adjacent to conductive line segment 319 is wider than the SIS 329 adjacent to the source electrode 306. By electrically connecting the conductive line 328 to the source electrode 306 within an area of the transistor 301 in a plan view, an overall size of semiconductor device 300 is reduced in comparison with other approaches that do not include SIS 329.

In FIG. 3B, semiconductor device 330 includes a substrate 332. In semiconductor device 330, substrate 332 is between transistor 331 and transistor 333. Transistor 331 has a channel bar 334 and a source electrode 336. Source electrode 336 is electrically connected to conductive line 342 by contact 338A. Power rail 340 extends parallel to conductive line 342, and conductive line 344 extends parallel to conductive line 342 above source electrode 336. Transistor 331 includes conductive line segment 349 which electrically connects conductive line 344 and contact 338B to SIS 359. SIS 359 extends through substrate 332 and electrically connects to source electrode 348 in transistor 333. In some embodiments, the conductive line segment 349 is formed simultaneously with the source electrode 336 and includes a same material as the source electrode 336.

Transistor 333 has a channel bar 346 and a source electrode 348. Source electrode 348 electrically connects to power rail 354 by contact 350. Conductive line 356 and conductive line 358 extend parallel to power rail 354 below source electrode 348 in transistor 333. By electrically connecting the conductive line 344 to the source electrode 348 using SIS 359, power from power rail 354 is provided to conductive line 344 in order to route the power on the opposite side of the substrate 332. As a result, an overall size of semiconductor device 330 is reduced in comparison with other approaches that do not include SIS 359.

The SIS 359 includes a single continuous structure having no interfaces therein. In some embodiments, the SIS 359 is formed in multiple deposition steps resulting in at least one noticeable interface. A width of the SIS 359 is substantially uniform along an entire length of the SIS 359. In some embodiments, the SIS 359 has a tapered profile. A direction of tapering for a tapered profile will depend on which side of the substrate 332 is processed in order to form the SIS 359. In some embodiments, where the first side of the substrate 332 is processed, a width of the SIS 359 adjacent to conductive line segment 349 is wider than the SIS 359 adjacent to the source electrode 348. In some embodiments, where the second side of the substrate 332 is processed, a width of the SIS 359 adjacent to source electrode 348 is wider than the SIS 359 adjacent to the conductive line segment 349.

In FIG. 3C, semiconductor device 360 includes transistor 361 on a first side of substrate 332, and a transistor 363A on a second side of substrate 332. In transistor 361, channel bar 364 is connected to source electrode 366. Source electrode 366 electrically connects to conductive line 372 by contact 368A. Power rail 370 and conductive line 374 extend parallel to conductive line 372 above transistor 361. Conductive line 374 electrically connects to conductive line segment 379A by contact 368B. In some embodiments, the conductive line segment 379A is formed simultaneously with the source electrode 366 and includes a same material as the source electrode 366.

In transistor 363, channel bar 376 is connected to source electrode 378. Power rail 384 is electrically connected to source electrode 378 by contact 380A. Conductive lines 386 and 388 extend parallel to power rail 380 below source electrode 378. Conductive line 388 electrically connects to conductive line segment 379B by contact 380B. In some embodiments, the conductive line segment 379A is formed simultaneously with the source electrode 378 and includes a same material as the source electrode 378.

SIS 389 electrically connects conductive line segment 379A to conductive line segment 397B. SIS 389 has one end which is approximately coplanar with a top surface of channel bar 364 and a second end which is approximately coplanar with a bottom surface of channel bar 376.

The SIS 389 includes a single continuous structure having no interfaces therein. In some embodiments, the SIS 389 is formed in multiple deposition steps resulting in at least one noticeable interface. A width of the SIS 389 is substantially uniform along an entire length of the SIS 329. In some embodiments, the SIS 329 has a tapered profile. A direction of tapering for a tapered profile will depend on which side of the substrate 362 is processed in order to form the SIS 389. In some embodiments, where the first side of the substrate 362 is processed, a width of the SIS 389 adjacent to conductive line segment 379A is wider than the SIS 389 adjacent to the conductive line segment 379B. In some embodiments, where the second side of the substrate 362 is processed, a width of the SIS 389 adjacent to conductive line segment 379B is wider than the SIS 389 adjacent to the conductive line segment 379A. By electrically connecting the conductive line 374 to the conductive line 388 directly through the substrate 362, an overall size of semiconductor device 360 is reduced in comparison with other approaches that do not include SIS 389. In addition, the shorter length of SIS 389 in comparison with other routing options reduces resistance, which reduces power consumption of semiconductor device 360 in comparison with other approaches that do not include SIS 389.

FIG. 3D is a cross-sectional view of semiconductor device 360. In comparison with FIG. 3C, FIG. 3D includes a tapered profile for SIS 389. FIG. 3D includes various dimensions that are not labeled in FIG. 3C for the sake of clarity. One of ordinary skill in the art would understand that the relative dimensions described with respect to semiconductor device 360 are also applicable to semiconductor device 300 (FIG. 3A) and semiconductor device 330 (FIG. 3B).

A first dimension D1 of the channel bar 364 in a first direction perpendicular to the top surface of the substrate 336 ranges from about 0.8 times to about 15 times a minimum gate width. If the first dimension D1 is too small, then resistance within a channel bar 364 increases and impacts device performance, in some instances. If the first dimension D1 is too large, then a size of the semiconductor device 360 is increased without significant improvement in device performance, in some instances. The minimum gate width is also referred to as a critical dimension (CD), in some instances. The minimum gate width is a smallest size that is reliably produced during a manufacturing process. One of ordinary skill in the art would recognize that different technology nodes have different manufacturing processes and are able to produce different minimum gate widths.

A ratio of the first dimension and a second dimension D2 of the power rail 370 in a second direction parallel to the top surface of the substrate 366 ranges from about 1 to about 5. If the second dimension D2 is too small, then resistance in the power rail 370 increases to a level that negatively impacts power consumption and uniform power distribution within the device, in some instances. If the second dimension D2 is too large, then a size of the semiconductor device 360 is increased without a significant improvement in performance, in some instances. In some embodiments, the power rail 384 has a same dimension as the power rail 370.

A ratio of the first dimension and a third dimension D3 of the conductive line 374 in the second direction ranges from about 0.5 to about 3. If the third dimension D3 is too small, then resistance in the conductive line 374 increases to a level that negatively impacts power consumption and signal reliability within the device, in some instances. If the third dimension D3 is too large, then a size of the semiconductor device 360 is increased without a significant improvement in performance, in some instances. In some embodiments, at least one of the conductive line 372, the conductive line 386 or the conductive line 388 has a same dimension as the conductive line 374.

A ratio of the first dimension and a fourth dimension D4 of the contact 368B in the first direction ranges from about 2 to about 6. If the fourth dimension D4 is too small, then spacing between the power rail 370 and the source electrode 366 increases a risk of short circuiting within the device, in some instances. If the fourth dimension D4 is too large, then a size of the semiconductor device 360 is increased without a significant improvement in performance, in some instances. In some embodiments, the contact 368A has a same dimension as the contact 368B. In some embodiments, a sixth dimension D6 of the contact 380B is equal to the fourth dimension D4. In some embodiments, the sixth dimension D6 is different from the fourth dimension D4.

A ratio of the first dimension and a fifth dimension D5 from a surface of the conductive line segment 379A closest to the substrate 366 to a surface of the conductive line segment 379B closest to the substrate 366 in the first direction ranges from about 10 to about 35. If the fifth dimension D5 is too small, then reliability of manufacturing the semiconductor device 360 is negatively impacted, in some instances. If the fifth dimension D5 is too large, then a size of the semiconductor device 360 is increased without a significant improvement in performance, in some instances.

A ratio of the first dimension and a seventh dimension D7 of a space between the conductive line 386 and the conductive line 388 in the second direction ranges from about 0.5 to about 3. If the seventh dimension D7 is too small, then a risk of short circuit within the device or negative impacts from parasitic capacitance impact device performance, in some instances. If the seventh dimension D7 is too large, then a size of the semiconductor device 360 is increased without a significant improvement in performance, in some instances. In some embodiments, a spacing between other combinations of adjacent conductive lines and/or power rails has a same dimension as the seventh dimension D7.

A ratio of the first dimension and an eighth dimension D8 of the conductive line segment 379A in the first direction ranges from about 2 to about 8. If the eighth dimension D8 is too small, then a size of the source electrode 366 is reduced and resistance within the source electrode 366 negative impacts power consumption, in some instances. If the eight dimension D8 is too large, then a size of the semiconductor device 360 is increased without a significant improvement in performance, in some instances. In some embodiments, a ninth dimension D9 of the conductive line segment 379B is equal to the eighth dimension D8. In some embodiments, the ninth dimension D9 is different from the eighth dimension D8.

Figure 4A:
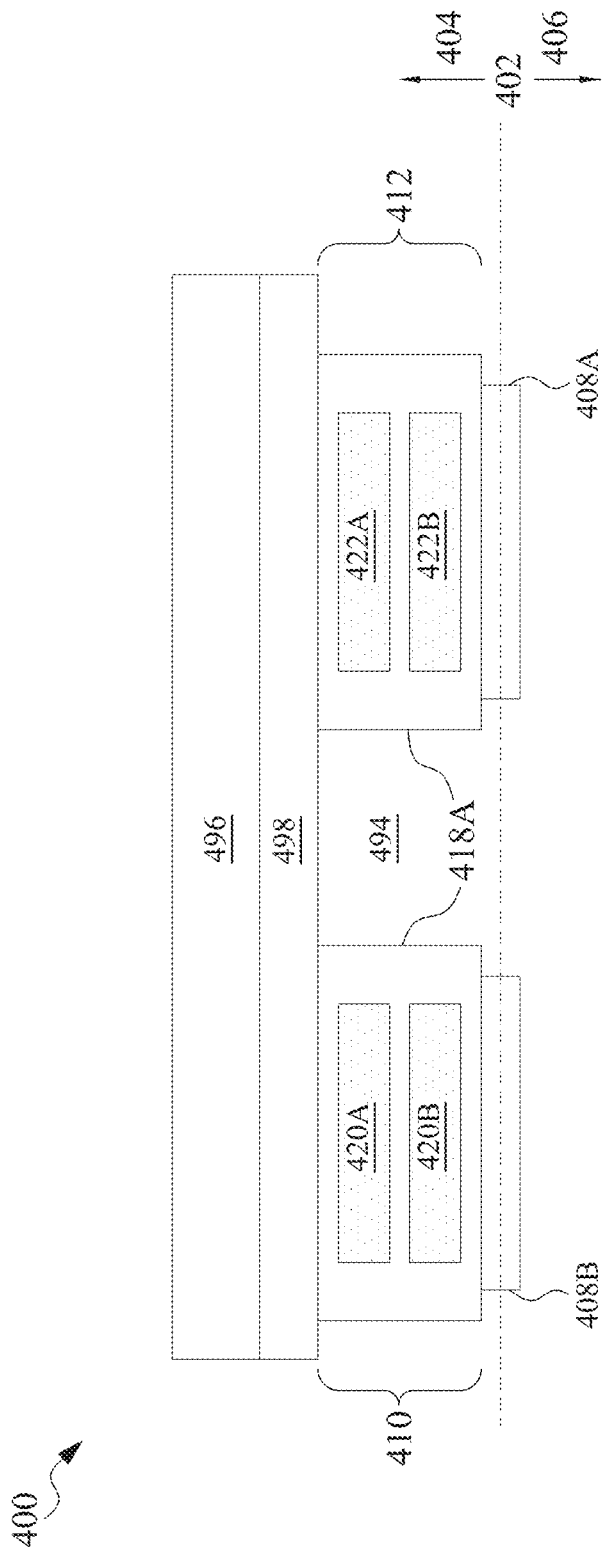
FIGS. 4A-4R are cross-sectional views of a semiconductor device at various stages during a manufacturing process, in accordance with some embodiments.
Figure 4B:
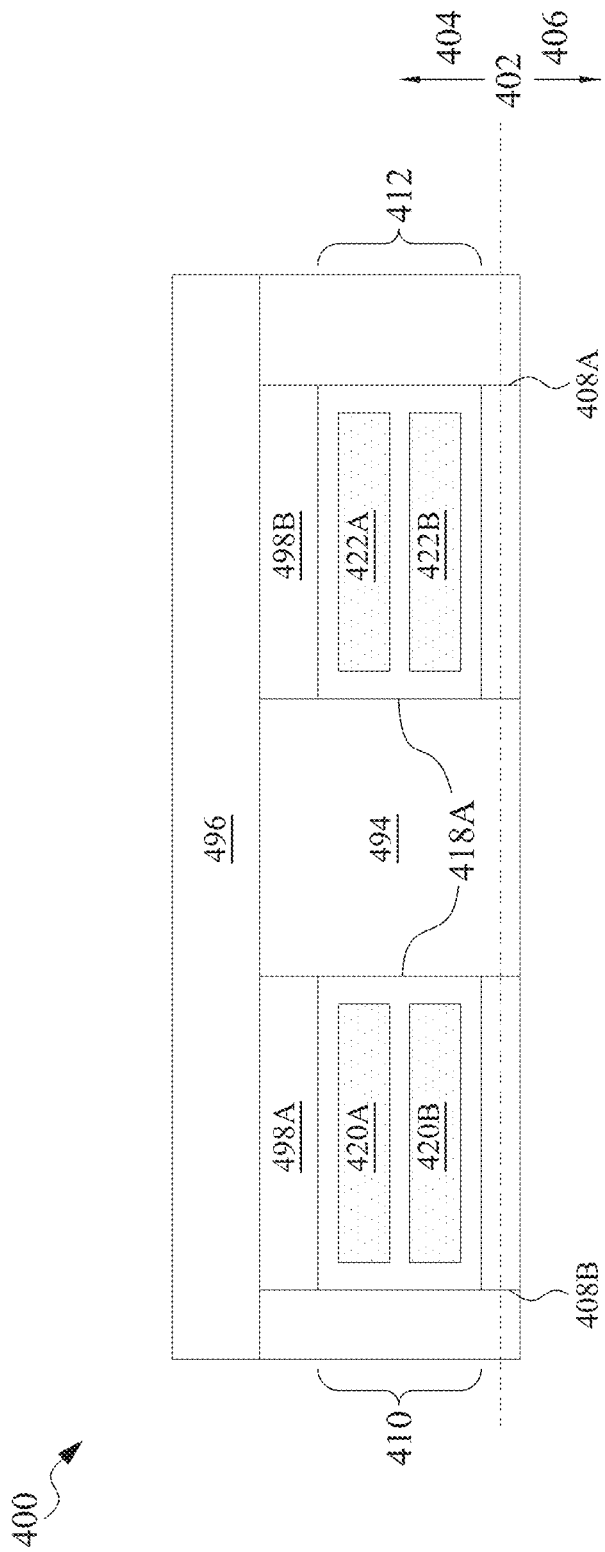
Figure 4C:
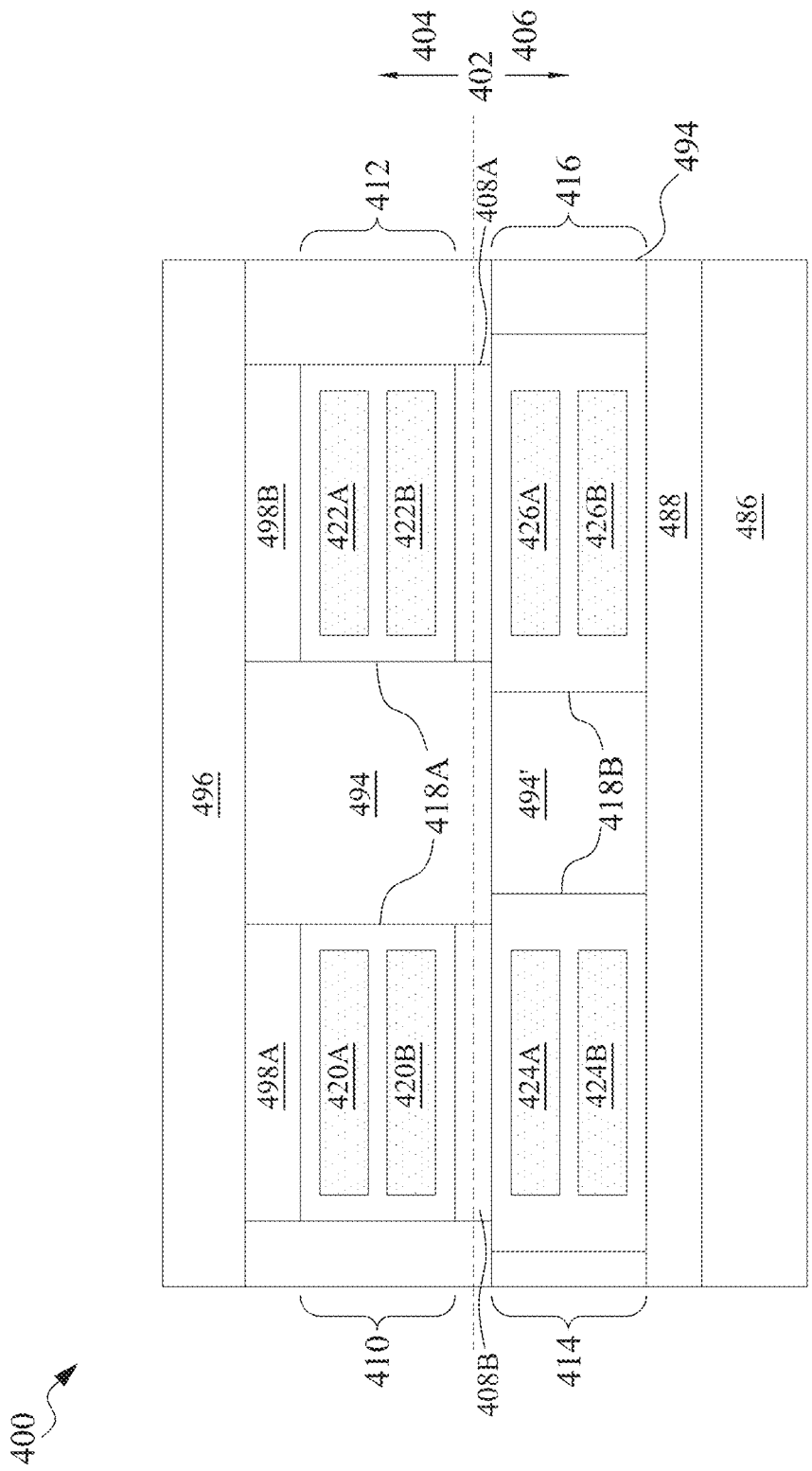
Figure 4D:
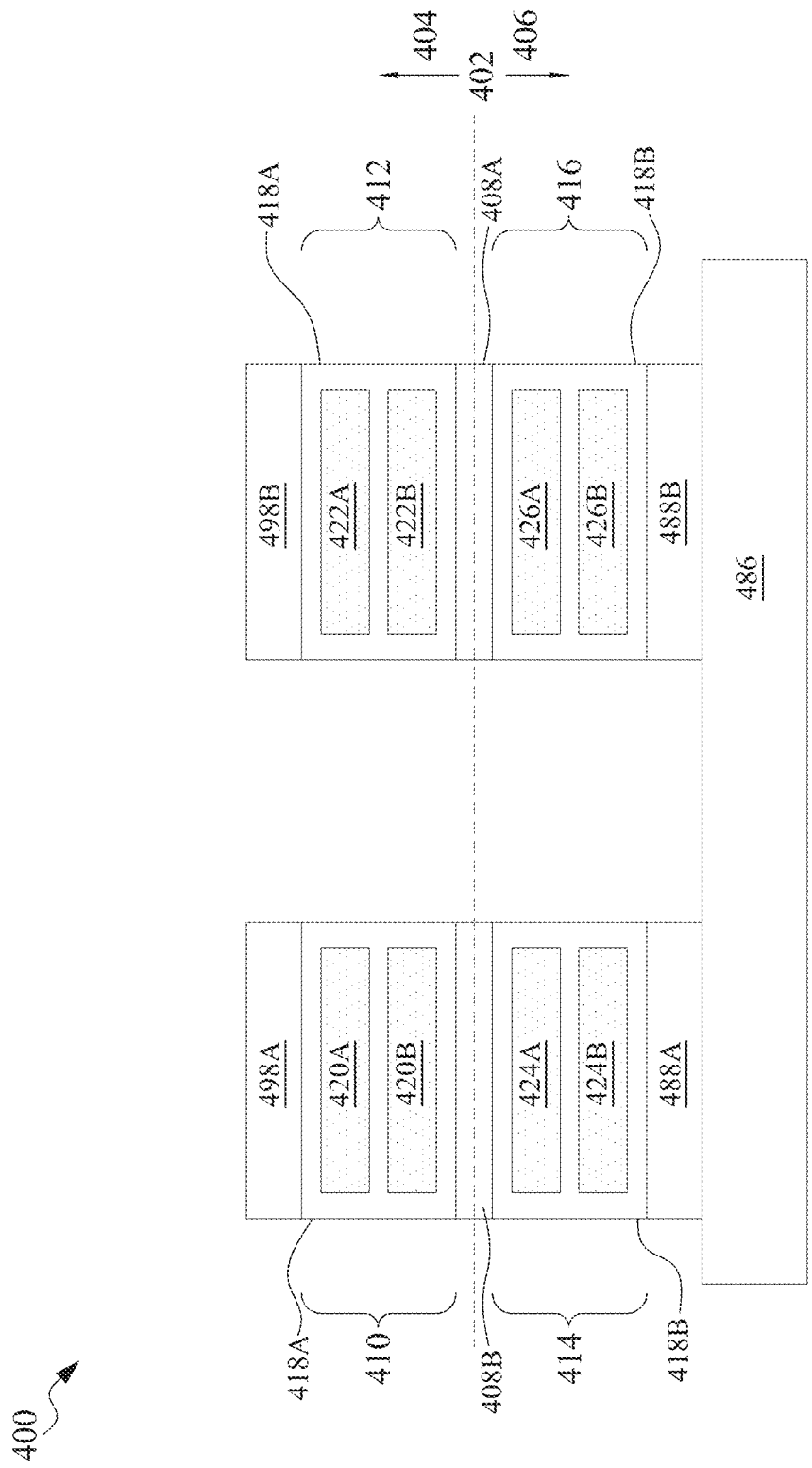
Figure 4E:
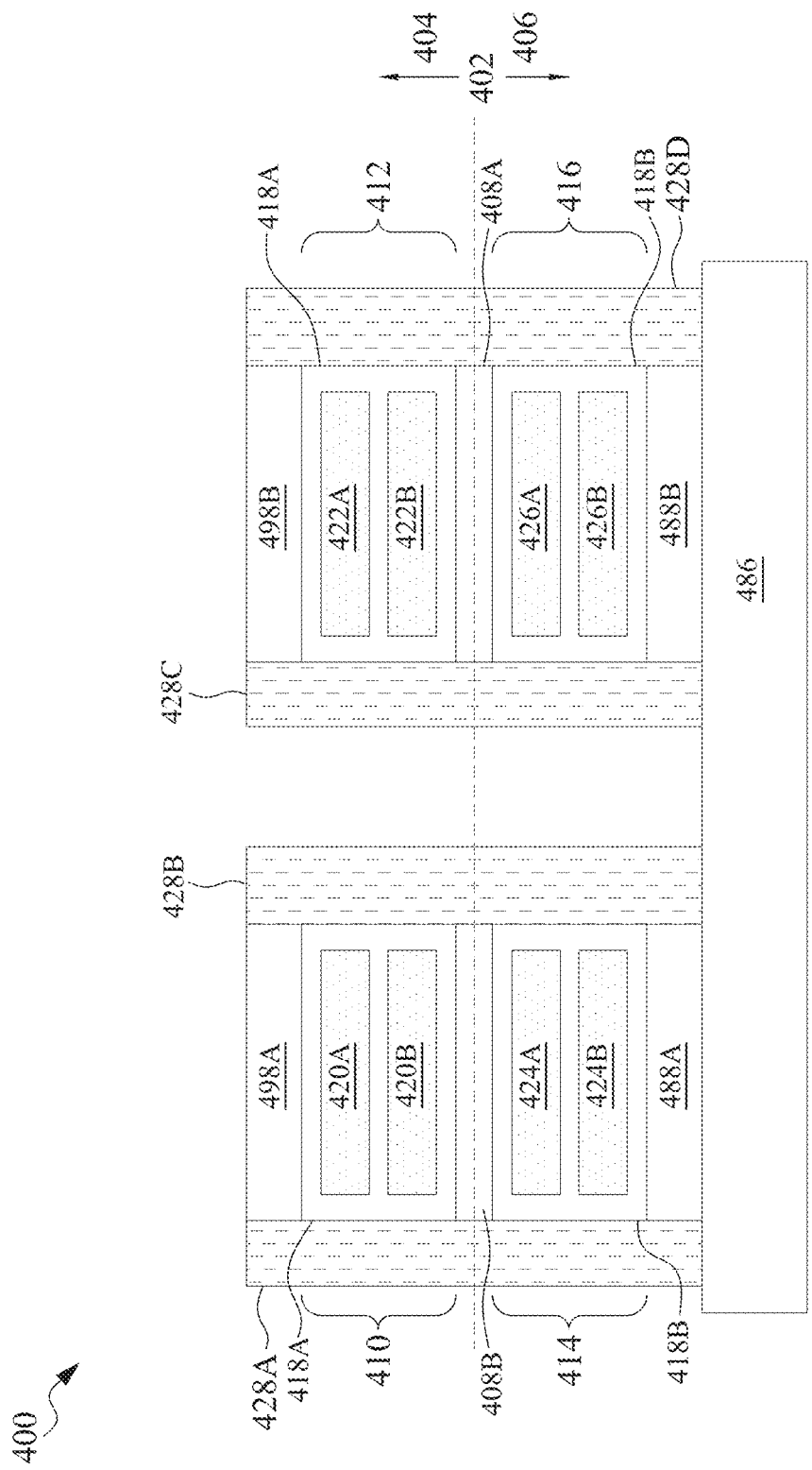
Figure 4F:
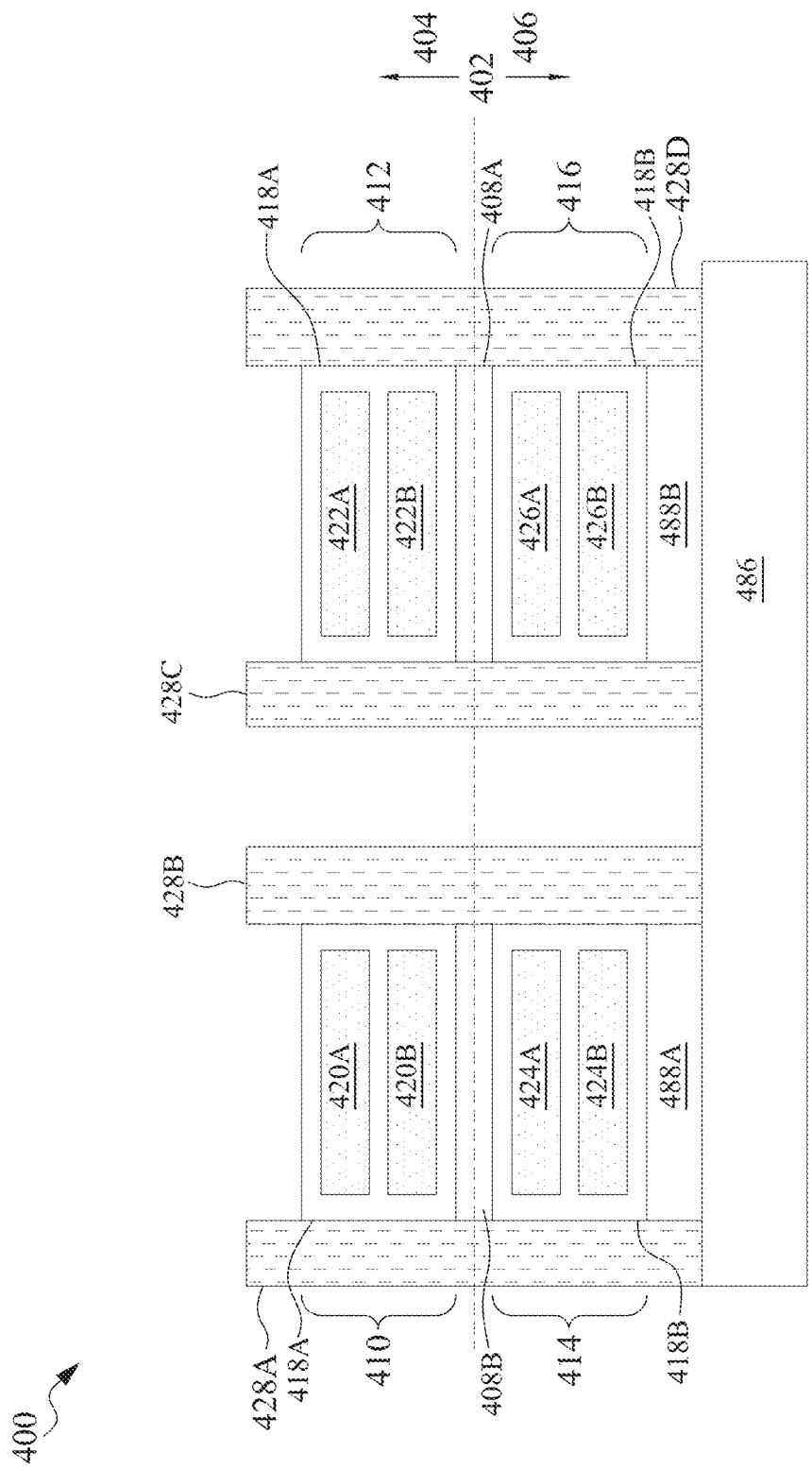
Figure 4G:
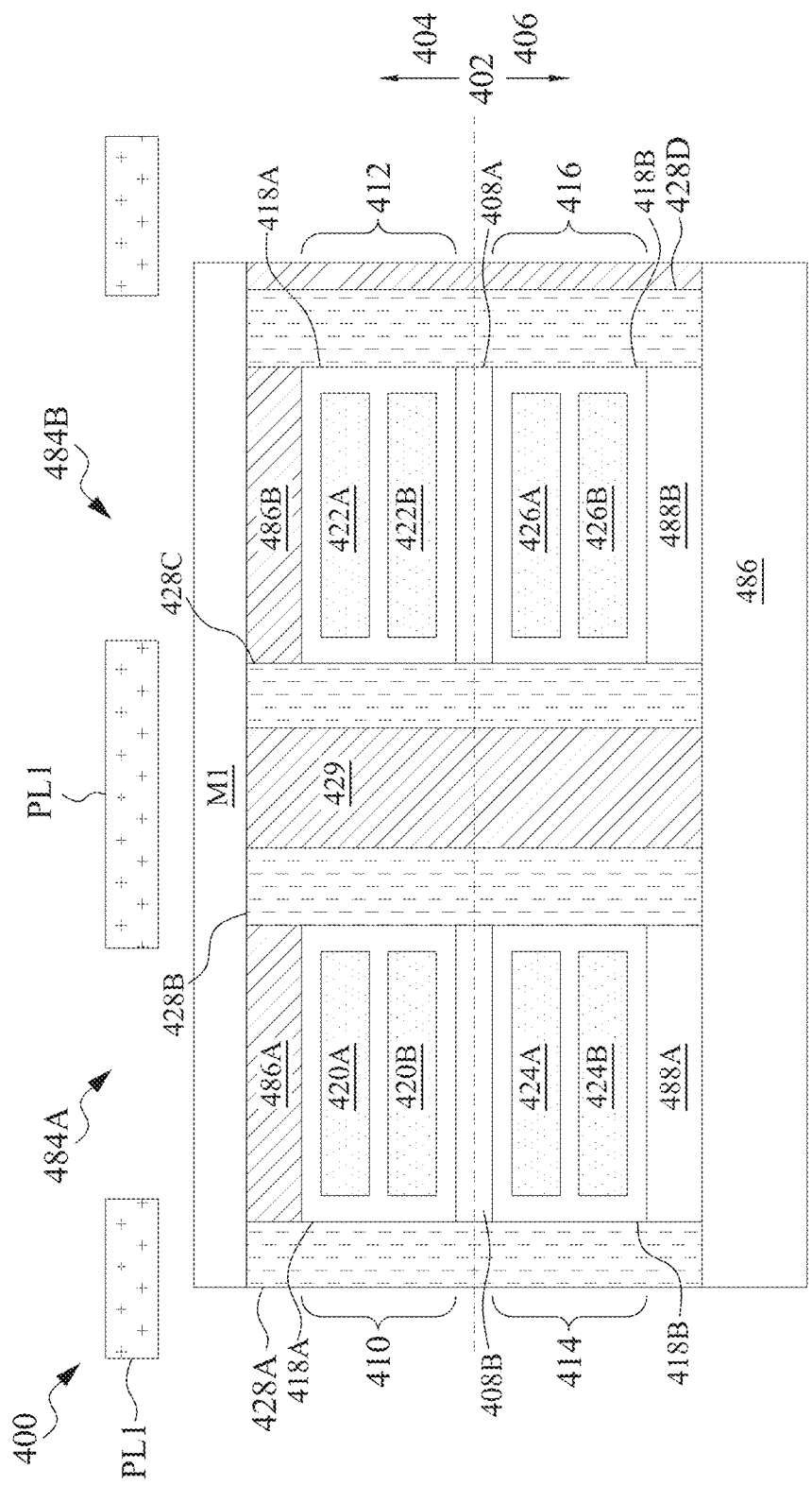
Figure 4H:
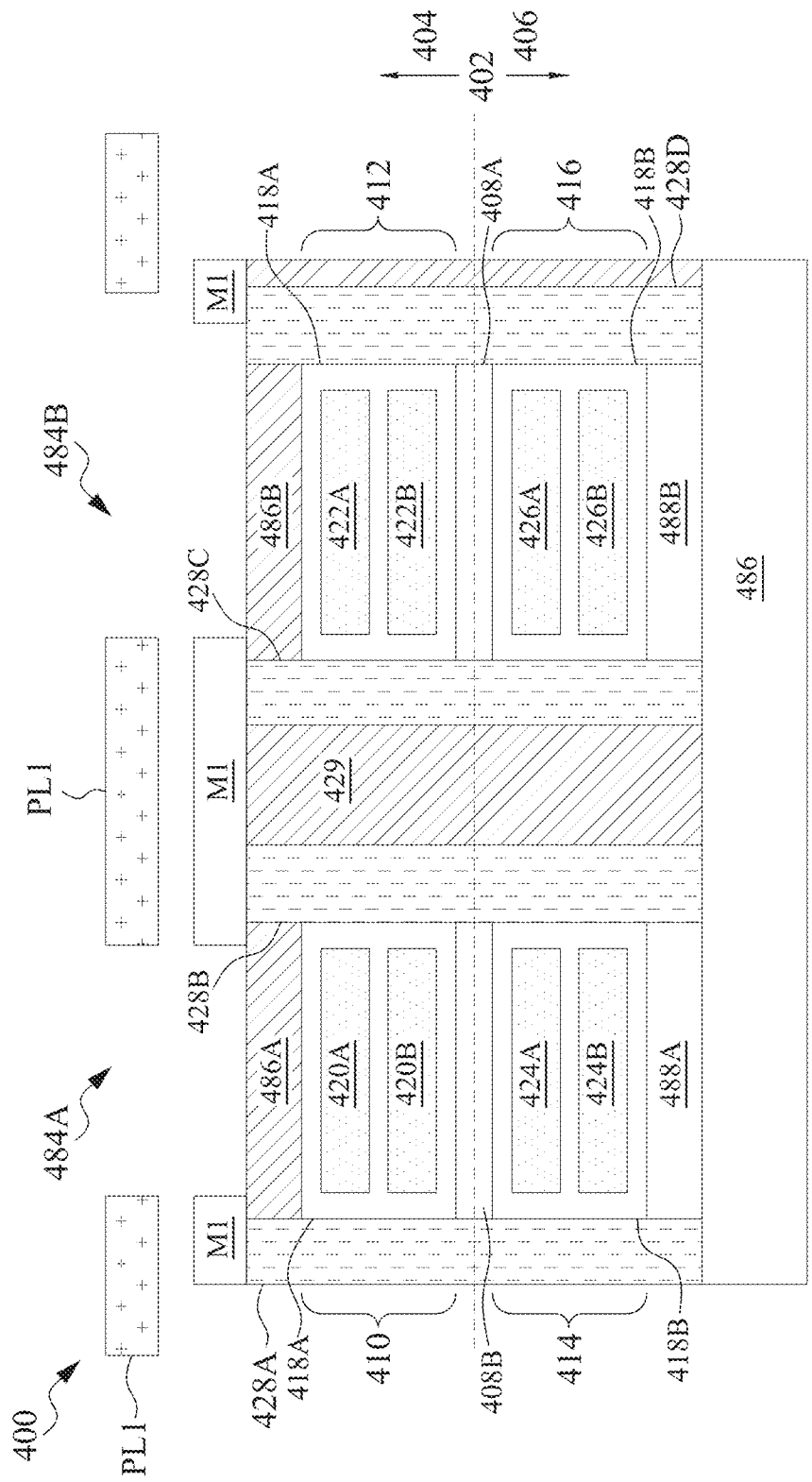
Figure 4I:
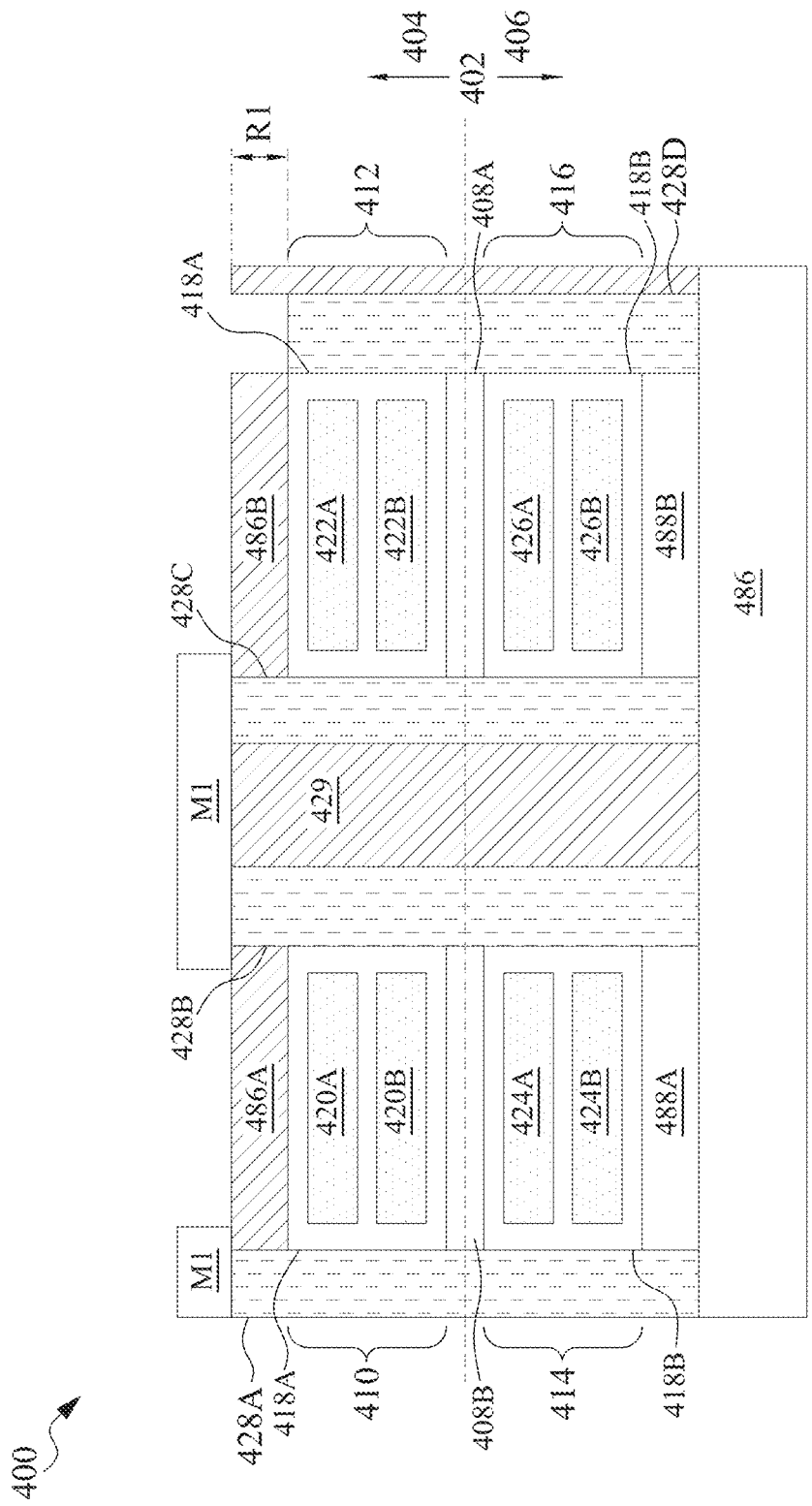
Figure 4J:
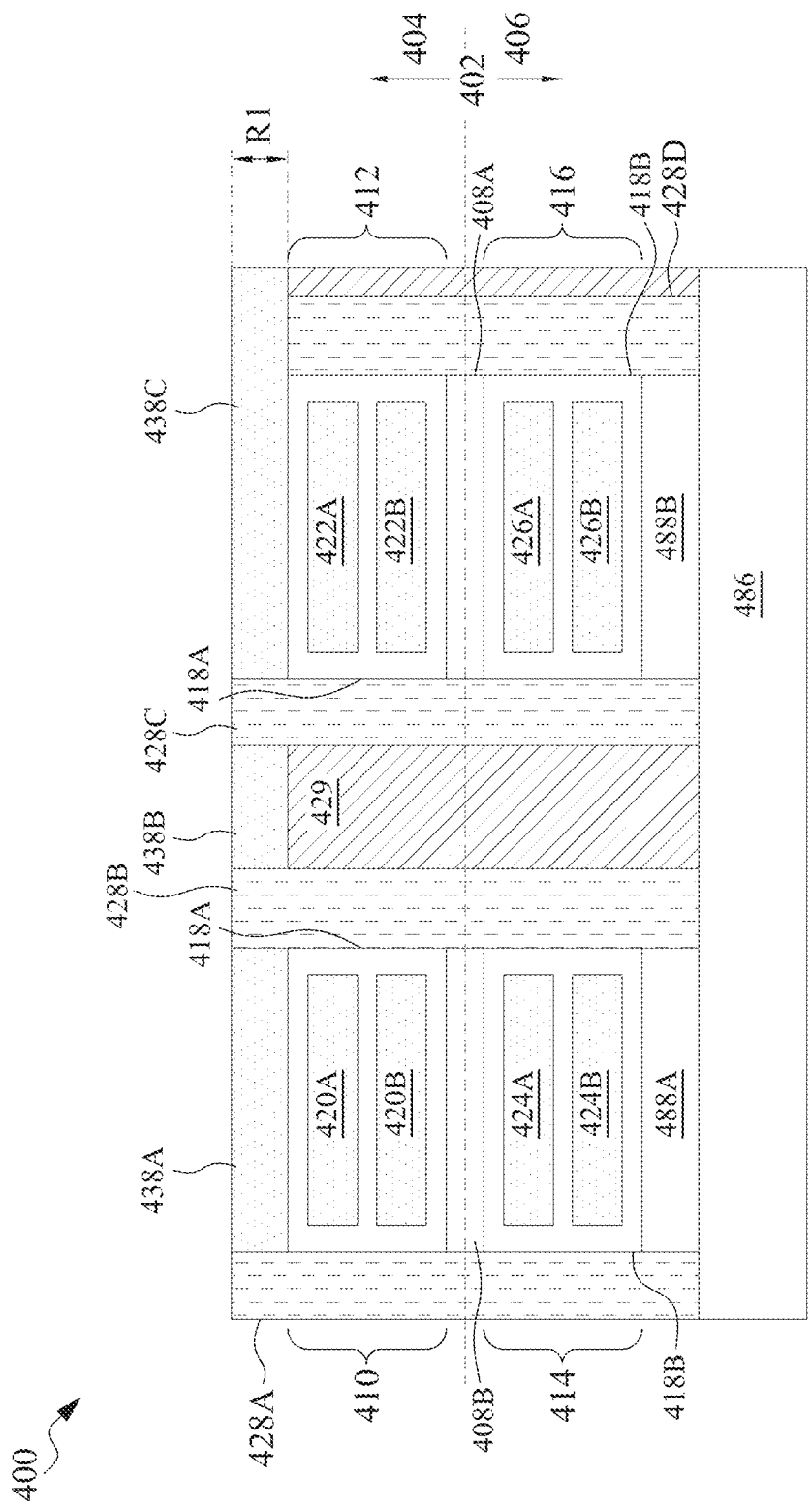
Figure 4K:
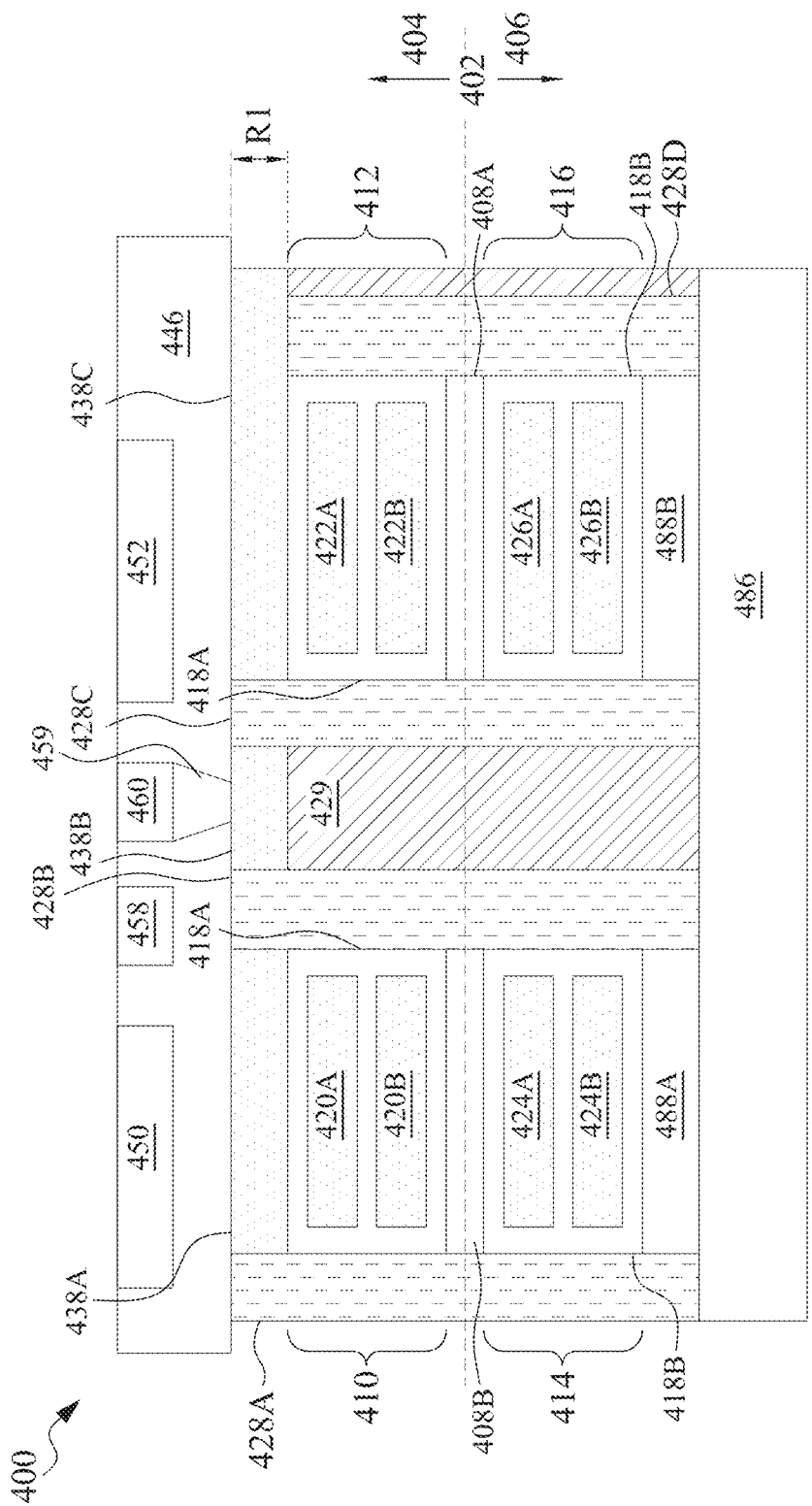
Figure 4L:
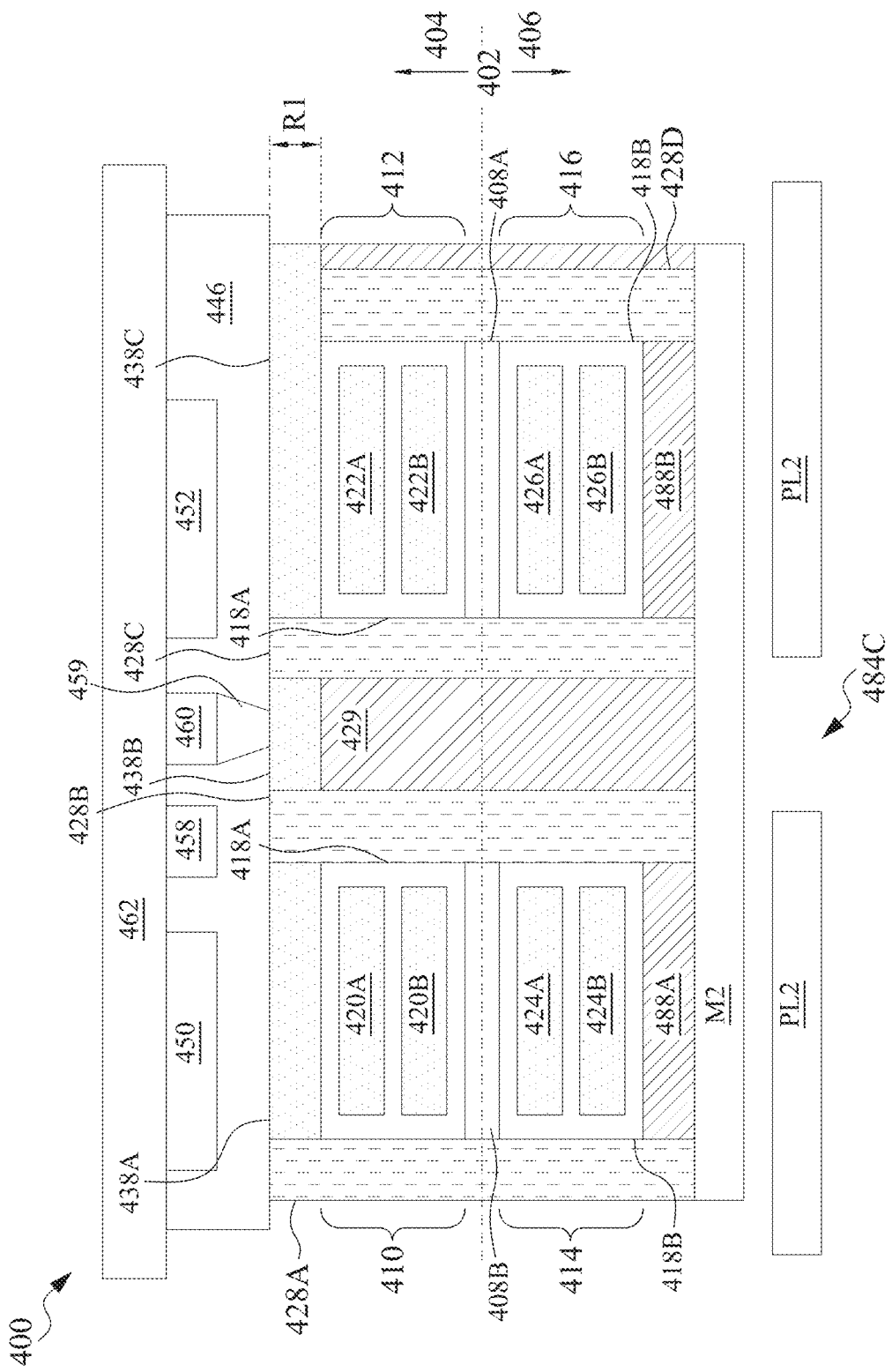
Figure 4M:
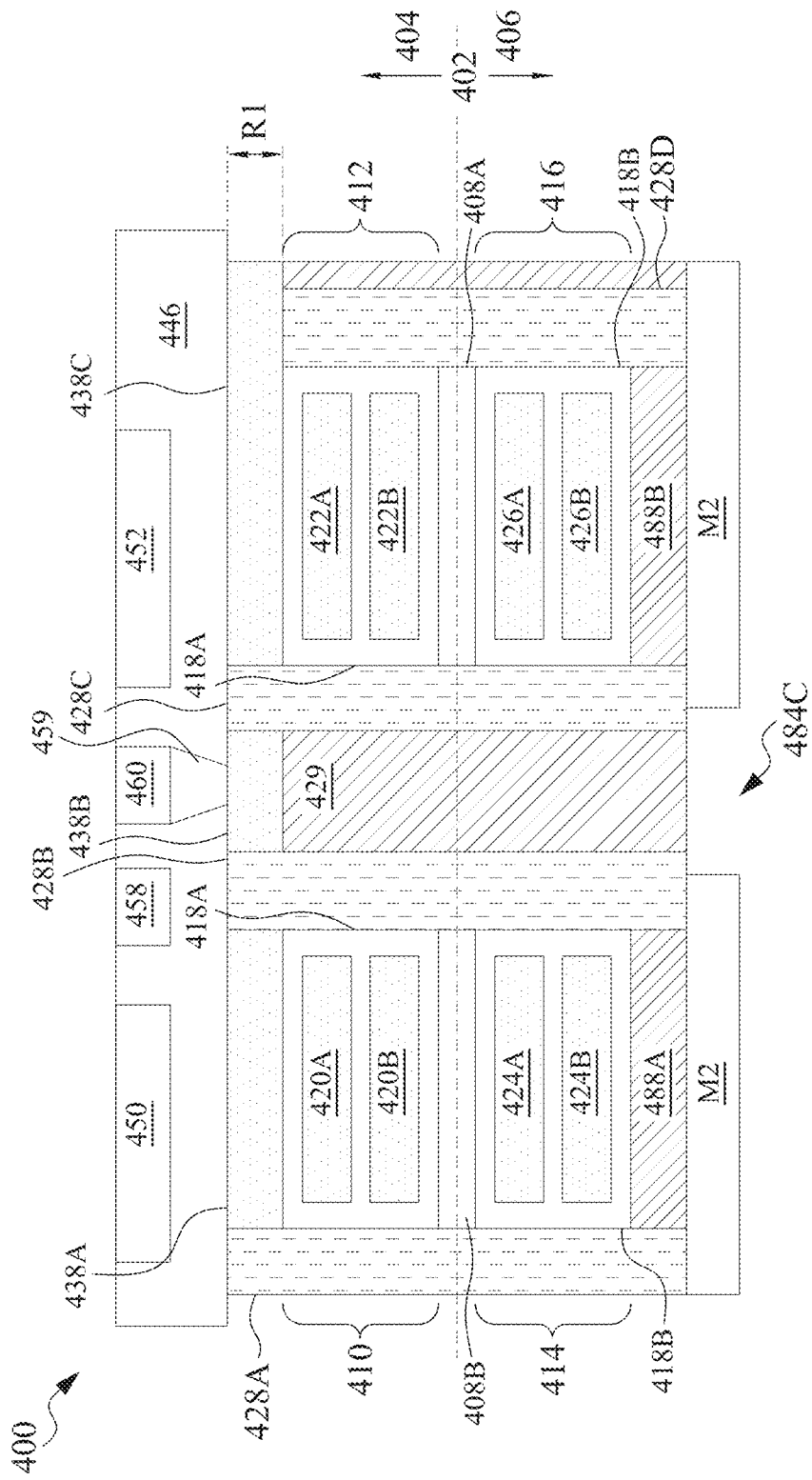
Figure 4N:
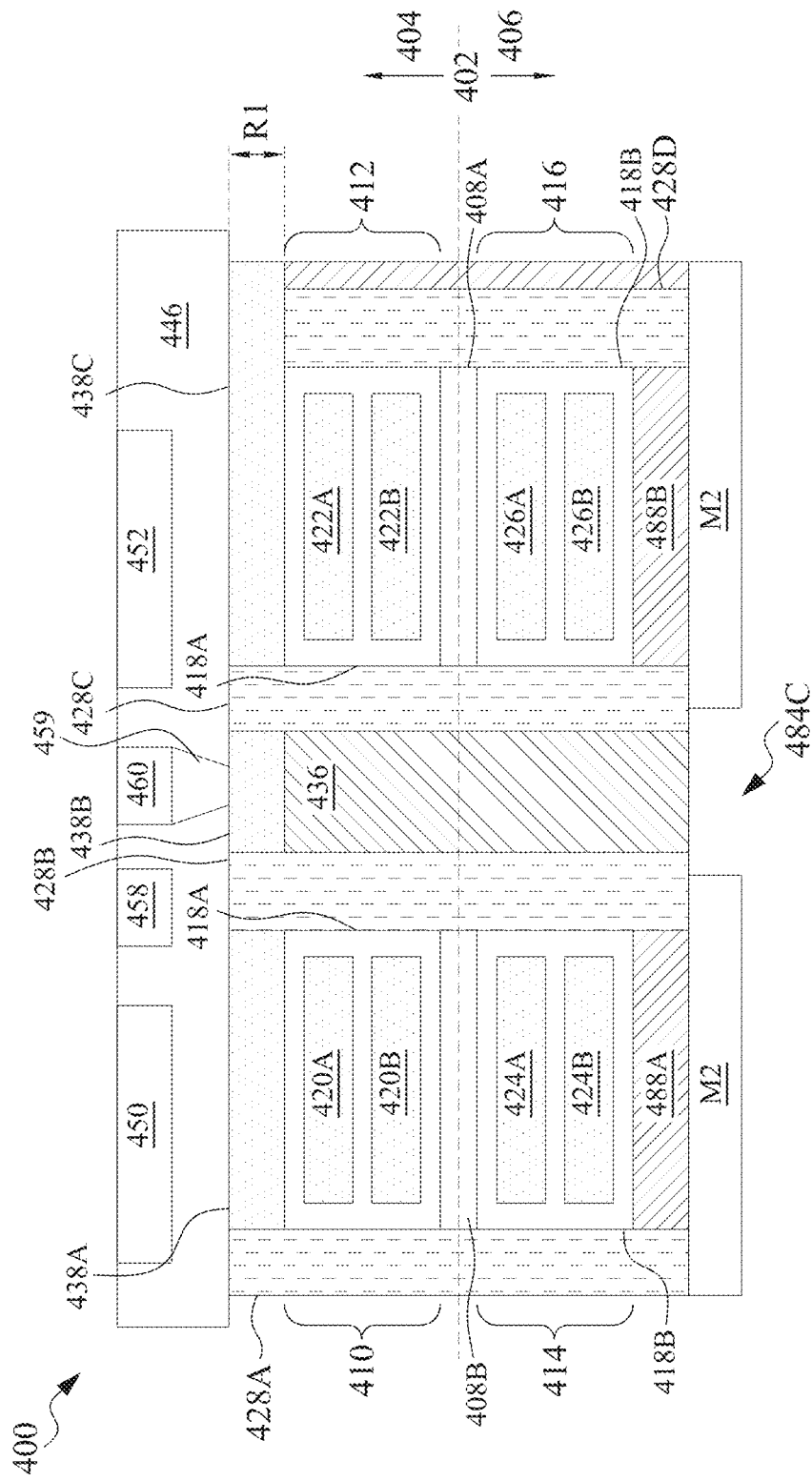
Figure 4O:
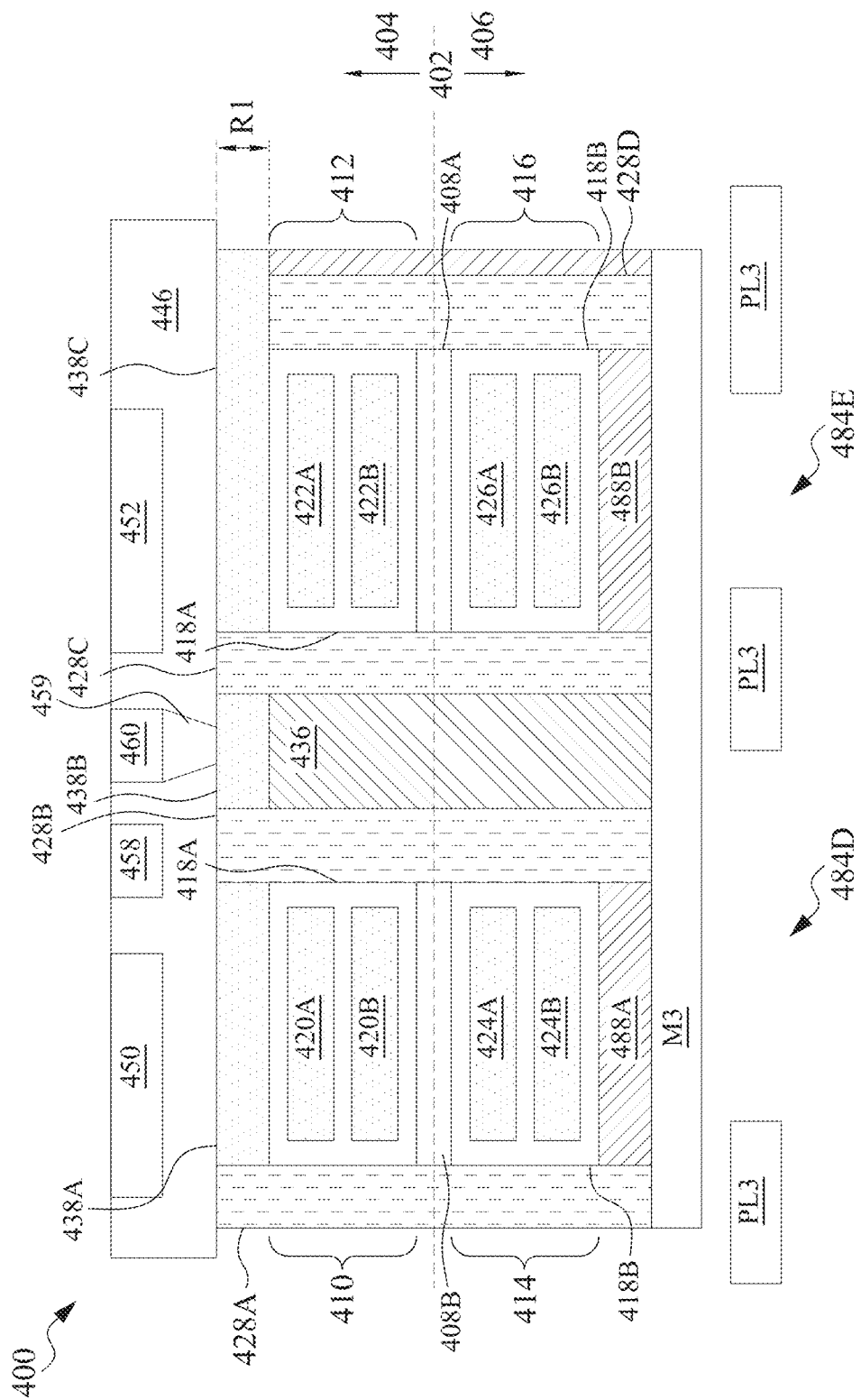
Figure 4P:
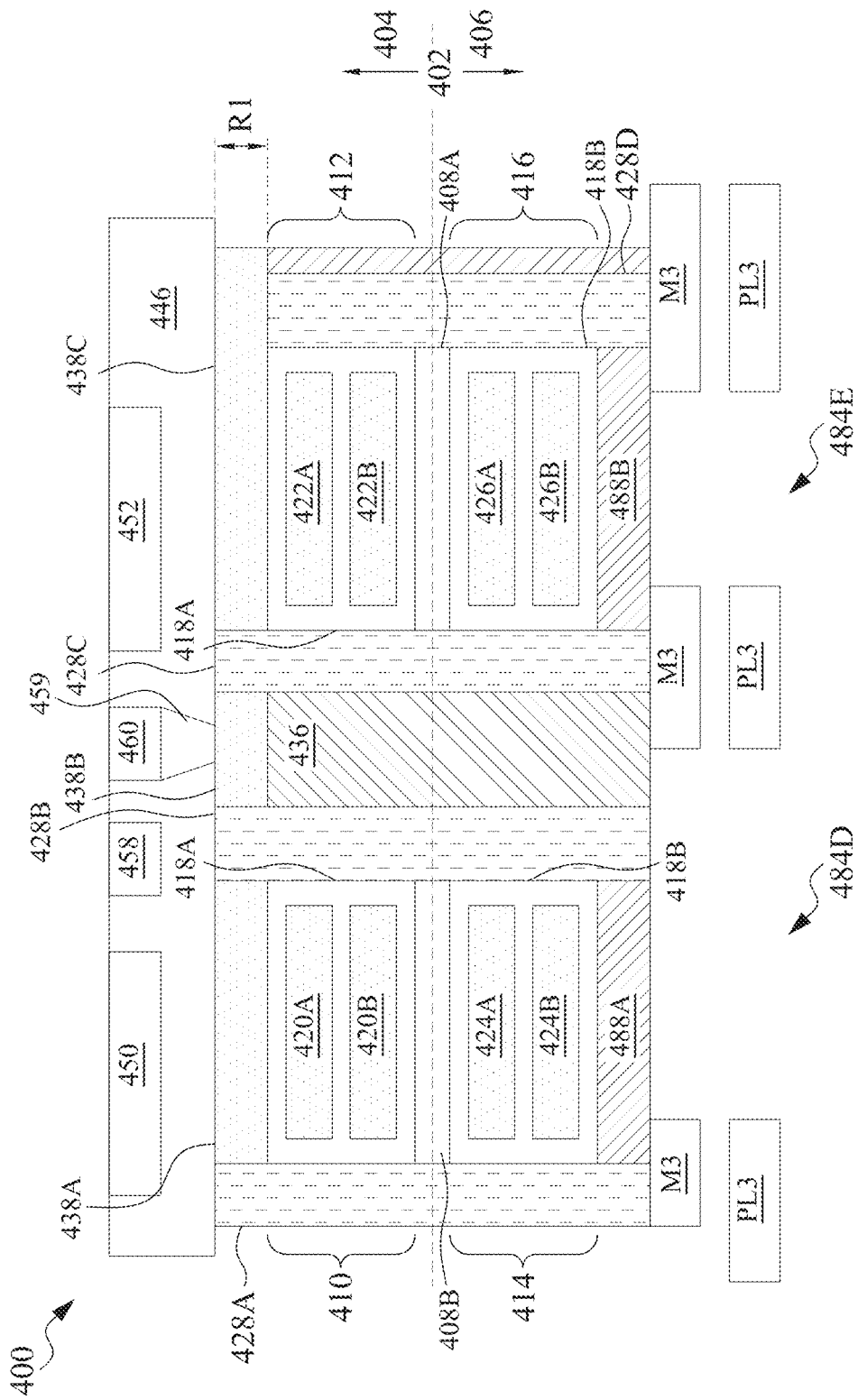
Figure 4Q:
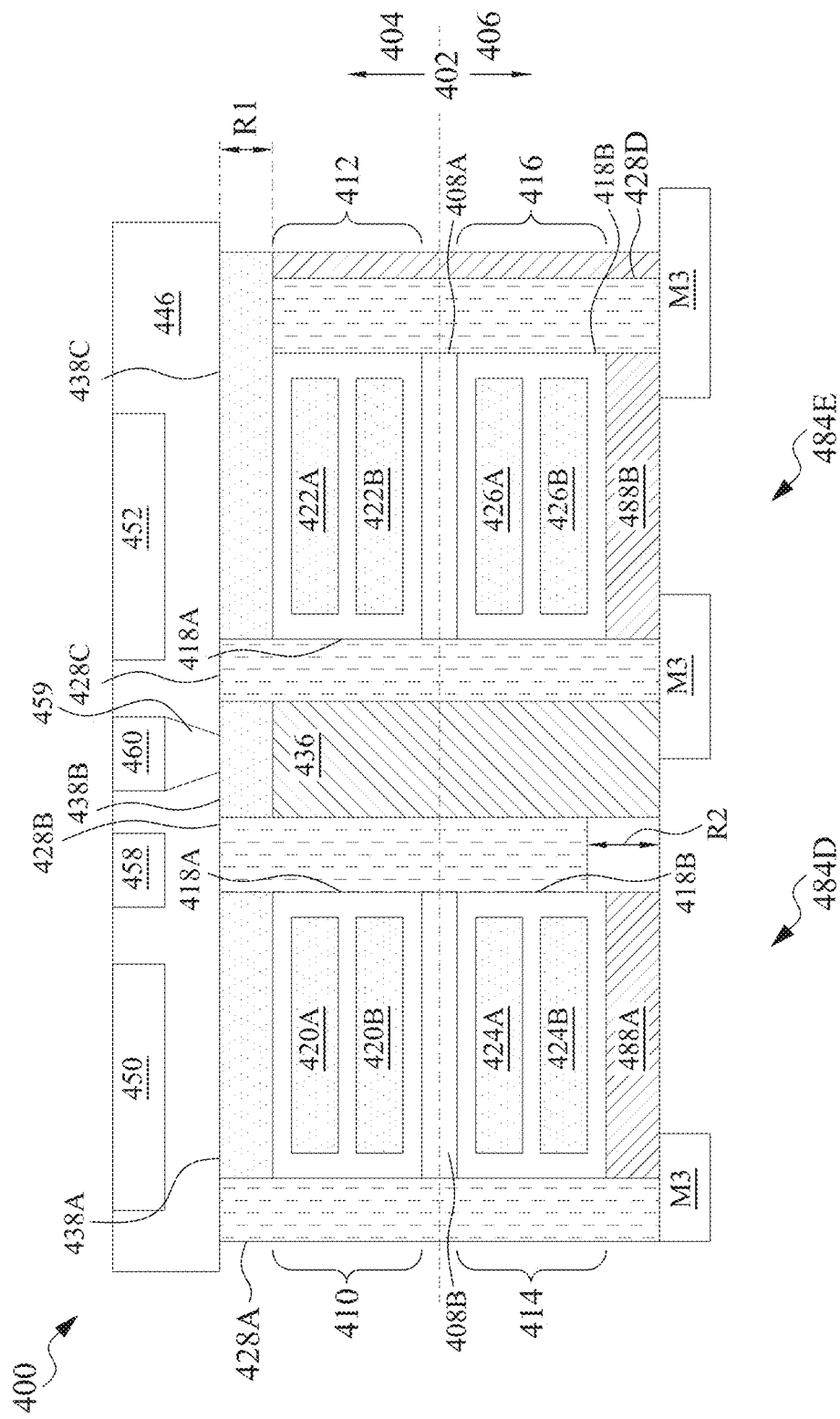
Figure 4R:
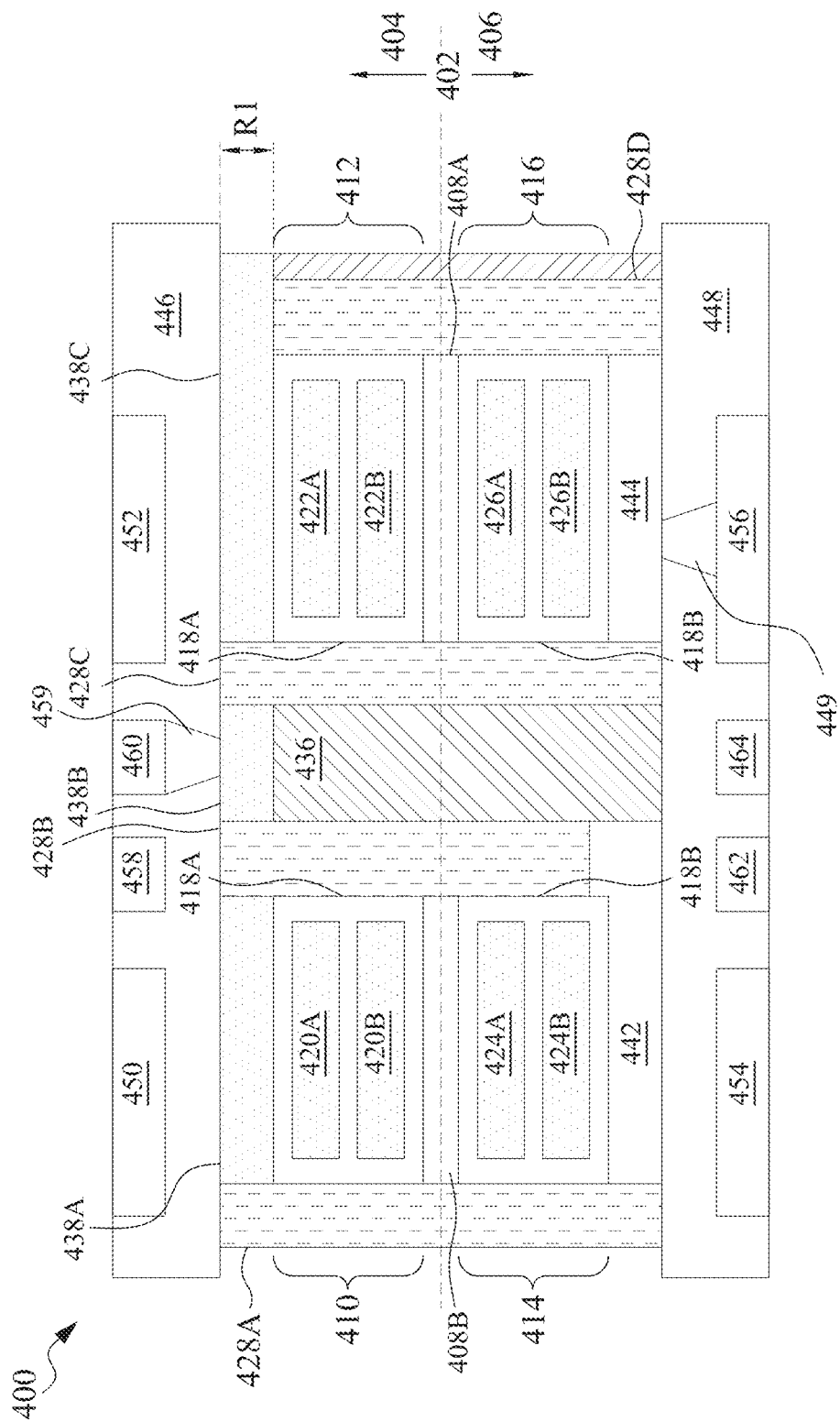
Figure 5:
FIG. 5 is a flow diagram of a method of making a semiconductor device, in accordance with some embodiments.

FIGS. 4A-4R are cross-sectional views of a semiconductor device during various stages of a manufacturing process, in accordance with some embodiments. FIGS. 4A and 4B are cross-sectional views of semiconductor device 400 during performance of operation 502 of method 500 (FIG. 5). FIGS. 4C and 4D are cross-sectional views of semiconductor device 400 during performance of operation 503. FIG. 4E is a cross-sectional view of semiconductor device 400 during performance of operation 504 of method 500. FIGS. 4F-4J are cross-sectional views of semiconductor device 400 during performance of operation 506 of method 500. FIG. 4K is a cross-sectional view of semiconductor device 400 during performance of operation 508 of method 500. FIGS. 4L-4N are cross-sectional views of semiconductor device 400 during performance of operation 510 of method 500. FIGS. 4O-4Q are cross-sectional views of semiconductor device 400 during performance of operation 512. FIG. 4R is a cross-sectional view of semiconductor device 400 during performance of operation 513.

In FIG. 4A, semiconductor device 400 includes transistor 410 and transistor 412 and a first side of a substrate. Reference line 402 extends through the substrate. The location of the substrate is indicated by substrate segments 408A and 408B. Transistor 410 and transistor 412 are on the first side of the substrate as indicated by first direction 404 from reference line 402. A layer of dielectric material 498 has been deposited over transistor 410 and 412. The layer of dielectric material 498 is bonded to a carrier 496. Support material (not shown) between transistor 410 and transistor 412 has been removed such that dielectric material 498 is exposed between the transistors. Transistor 410 includes source regions 420A40B surrounded by source electrode material 418A. Transistor 412 includes source regions 422A and 422B surrounded by source electrode material 418A. One of ordinary skill in the art would understand that FIG. 4A includes source regions 420A, 420B, 422A and 422B due to the location of the cross-sectional view. A cross-sectional view of semiconductor device 400 taken at a different location along a direction perpendicular to the first direction 404 would include channel regions or drain regions, in some instances.

In FIG. 4B, an etch process has been performed to trim electrode material 418A to have sidewalls which are aligned with the edges of substrate segments 408A and 408B. Further, dielectric material 498 has been trimmed to dielectric material segments 498A and 498B with sidewalls aligned with the sidewalls of transistors 410 and 412. Thus, electrode material 418A in transistor 410 is aligned dielectric material segment 498A and electrode material 418A in transistor 412 is aligned dielectric material segment 498B. A support material 494 has been deposited between and around transistors 410 and 412, and planarized to expose substrate segments 408A and 408B.

In FIG. 4C, transistors 414 and 416 have been manufactured on a second side of substrate segments 408A and 408B in the second direction from reference line 402. Additional support material 494' has been deposited around and between transistor 414 and transistor 416, and contacts support material 494 between substrate segments 408A and 408B. Transistor 414 includes source region 424A and source region 424B surrounded by electrode material 418B. Transistor 416 includes a source region 426A and source region 426B surrounded by electrode material 418B. The edges of electrode material 418B are misaligned with the edges of substrate segment 408B against transistor 414, and the edges of electrode material 418B are misaligned with respect to substrate segment 408A against transistor 416. A hard mask 488 is deposited on electrode material 416B at a side opposite from the side contacting substrate segments 408A and 408B. A carrier 486 is bonded to the hard mask 488.

In FIG. 4D, an etch process has been performed to trim electrode material 418B to have sidewalls aligned with the edges of substrate segments 408A and 408B, forming transistor stacks which include substrate segments 408A and 408B in the middle thereof. Hard mask 488 has been trimmed as follows: hard mask segment 488A is along a bottom side of the transistor 414 and hard mask segment 488B is along a bottom side of transistor 416. The etch process performed to trim hard mask material 418B exposes a top surface of carrier 486. Carrier 496 has been removed and support material 494 between and around the transistors 410-416 has been removed in order to trim electrode material 418B and hard mask 488.

In FIG. 4E, a spacer material is deposited against the top surface of carrier for 86 and against the sidewalls of the hard mask segments 488A and 488B, the transistors 410, 412, 414 and 416, the substrate segments 408A and 408B, and the dielectric material segments 498A and 498B. Thus, spacer segment 428A and spacer segment 428B are against hard mask segment for 488A, transistor 414, substrate segment 408B, transistor 410, and dielectric material segment 498A. Further, spacer segment 428C and spacer segment 428D are against hard mask segment 488B, transistor 416, substrate segment 408A, transistor 412, and dielectric material segment 498B. The top surface of carrier 486 has been exposed adjacent to the end of the spacer material in proximity to the hardmask segments 488A and 488.

In FIG. 4F, dielectric material segments 498A and 498B have been removed by, e.g., a selective etch process to expose an inner sidewall of spacer segments 428A-428D, and a top surface of transistor 410 and transistor 412, i.e., a top surface of electrode material 418A.

In FIG. 4G, a dielectric material 429 has been deposited against the spacer material. The dielectric material 429 extends from the carrier for 486 to above a top surface of transistor 410 and transistor 412. The dielectric material is planarized to expose the ends of spacer material distal from carrier 486, and a hard mask M1 has been deposited against the top surface of the space material and the dielectric material 429. Dielectric material segment 486A and dielectric material 486B, which are formed during the deposition of the dielectric material 429, are surrounded by spacer material and covered by hard mask M1. A layer of patterning material PL1 has been deposited over hard mask M1, and the layer of patterning material PL1 is patterned to form openings 484A and 484B therein. A first opening 484A is over the transistor 410 and dielectric material segment 486A, and a second opening 484B is over transistor 412, dielectric material segment 486B, and spacer segment 428D.

In FIG. 4H, an etch process has been performed in order to form openings in the hard mask M1 corresponding with the openings in the layer of patterning material PL1. Thus, opening 484A extends through layer of patterning material PL1, and hard mask M1, and exposes a top surface of dielectric segment 486A. Similarly, opening 484B extends through layer of patterning material PL1, and hardmask M1, and exposes a top surface of dielectric material segment 486B and spacer segment 426D.

In FIG. 4I, layer of patterning material PL1 has been removed and a selective etch process has been performed to recess spacer segment 428D by a depth R1 such that the end of spacer segment 428D distal from carrier for 486 is approximately coplanar with a top surface of transistor 412.

In FIG. 4J, the hard mask M1 has been removed, e.g., by ashing, and an upper portion of dielectric material 429 has been recessed to a depth R1 below the top surface of spacer segments 428A, 428B, and 428C, such that an end of dielectric material 429 distal from carrier for 486 has a top surface is approximately coplanar with the top surface of transistor 412 and transistor 410. In FIG. 4J, transistor electrode 438A is against a top surface of transistor 410, transistor electrode 438C is against a top surface of transistor 412, and an interconnect electrode 438B is against a top surface of dielectric material 429 between spacer segment 428B and spacer segment 428C.

In FIG. 4K, a first interconnect layer has been manufactured above transistor electrodes 438A, 438C, and interconnect electrode 438B. First interconnect layer includes a dielectric material 446 having therein a contact 459 which electrically connects interconnect electrode 438B to conductive line 460. Power rail 450 and power rail 452 extend parallel to conductive line 460 within dielectric material 446. Conductive line 458 extends parallel to conductive line 460 between conductive line 460 and power rail 450.

In FIG. 4L, the first interconnect layer has been bonded to a carrier 462 and the semiconductor device has been inverted to facilitate manufacturing of features against transistors 414 and 416. In FIG. 4L, semiconductor 400 is shown in a same orientation as in previous figures for clarity.

A hard mask M2 has been deposited against hard mask segments 488A, below transistor 414, mask segment 488B, below transistor 416, and the ends of spacer segments 428A-428D which are distal from dielectric material 446. A layer of patterning material PL2 has been deposited in proximity to hard mask M2, and an opening 484C formed therein to expose hard mask M2.

In FIG. 4M, an etch process has been performed to form the opening 484C through hard mask M2, exposing an end of dielectric material 429 distal from dielectric material 446, in preparation for an etch process to remove the dielectric material A3. Layer of patterning material PL2 has been removed from the semiconductor device.

In FIG. 4N, dielectric material 429 has been removed from between spacer segments 428B and 428C, exposing a bottom surface of interconnect electrode 438B, and an interconnect material 436 has been deposited against the exposed surface of interconnect electrode 438B and spacer segments 428B and 428C. The interconnect material 436 has been etched, or planarized, or recessed, such that a bottom end of interconnect material 436 is approximately coplanar with the ends of spacer segments 428B and 428C which are distal from dielectric material 446.

IN FIG. 4O, hardmask M2 has been removed, e.g., by ashing, and third hardmask M3 has been deposited along the hardmask segments 448A, 448B, the ends of spacer segments 428A-428D distal from dielectric material 446, and the end of interconnect material 436 distal from dielectric material 446. A layer of patterning material PL3 has been deposited in proximity to third hardmask M3 with openings 484D and 484E therein, such that opening 484D is aligned with hardmask segment 488A and spacer segment 428B, and opening 484E is aligned with hardmask segment 488B.

In FIG. 4P, an etch process has been performed to extend openings 484D and 484E through third hardmask M3 to expose a bottom surface of hardmask segment 488A, spacer segment 428B, and a portion of interconnect material 436 (through opening 484D), and hardmask segment 488B (through opening 484E).

In FIG. 4Q, layer of patterning material PL3 has been removed and an etch process has been performed to recess spacer segment 428B to a depth R2 to expose a sidewall of electrode material 418B. In some embodiments, the spacer segment is recess but the sidewall of the transistor electrode material is not exposed when the recess process is completed. In some embodiments, a surface of spacer segment 428B distal from dielectric material 446 is substantially coplanar with a surface of source region 424B. In some embodiments, the surface of spacer segment 428B distance from dielectric material 446 is offset with respect to the surface of source region 424B.

In FIG. 4R, third hardmask M3 has been removed and a selective etch process has been performed to remove hardmask segments 488A and 488B, exposing the surfaces of transistor 414 and 416. An electrode material has been deposited into the openings formed by the removal of hardmask segments 488A and 488B to form electrode 442 against transistor 414, and electrode 444 against transistor 416. Electrode 442 is against the bottom surface and sidewall of transistor 414, and against a sidewall of interconnect material 436. Electrode 444 is against a bottom surface of transistor 416, and electrically isolated from interconnect material 436 by spacer segment 428C.

A second interconnect layer has been manufactured at the bottom side of transistor electrodes 442 and 444. The second interconnect layer includes a dielectric material 448, and a contact 449 in electrical contact with transistor electrode 444 and power rail 456. Power rail 454 and conductive lines 462 and 464 are located in dielectric material 448 below transistor 414 and interconnect material 436 and extend parallel to power rail 456.

FIG. 5 is a flow diagram of a method 500 of making a semiconductor device, in accordance with some embodiments. According to some embodiments, method 500 is used to manufacture a semiconductor device with two layers of transistors, or stacked transistor structures. In some embodiments, method 500 is used to manufacture semiconductor devices with a single layer of transistors. In some embodiments, method 500 is adapted to manufacture a SIS from the top side of the semiconductor device. In some embodiments, method 500 is adapted to manufacture a SIS from the bottom side of the semiconductor device.

Method 500 includes an operation 502 wherein a first transistor is manufactured over a substrate. In FIGS. 4A and 4B, described below, a semiconductor device 400 undergoes manufacturing processes consistent with operation 502, as described herein.

In operation 502, a first transistor is manufactured over a substrate. In some embodiments, the substrate is a silicon wafer on which subsequent layers of material are deposited in order to form the first transistor or other circuit elements. The first transistor includes a channel bar having a source region, a drain region, and a channel region between the source and drain regions. Manufacturing a transistor on a top side of the substrate includes steps associated with depositing alternating layers of semiconductor material over the substrate to form the source region, drain region, and channel region of the transistor. In some embodiments, the transistor includes a support material and a semiconductor material deposited in alternating layers, where the semiconductor material and the support material exhibit a high differential etch rate. By taking advantage of the high differential etch rate, support material is removed from a middle portion of the transistor structure, leaving behind the semiconductor material in the channel region. According to some embodiments, the support material and semiconductor material remain unmodified in a source region and a drain region of the transistor.

In operation 502, subsequent to manufacturing a transistor stack, source electrode material and drain electrode material (not shown in FIG. 4A) are deposited in proximity to the source region and drain region of the transistor. According to some embodiments, source electrode material includes a semiconductor material such as polysilicon, or a conductive material such as tungsten, titanium, cobalt, tantalum, platinum, nickel, and so forth. In embodiments of operation 502 manufacturing transistors having a semiconductor material for the source electrode material, deposition of the semiconductor material is performed by a chemical vapor deposition process. In embodiments of operation 500 to manufacturing transistors having a conductive material for the source electrode material, deposition of the conductive material is by sputtering or metal diffusion.

In operation 502, subsequent to manufacturing the transistor stack and source electrode material, a supporting dielectric material (not shown in FIG. 4A) is deposited over the transistor in order to provide support and stability during handling. Subsequent to depositing the supporting dielectric material, a blanket film of dielectric material is deposited at a top end of the transistor (e.g., at the end opposite from the substrate) in order to promote safe handling during manufacturing. According to some embodiments, the supporting dielectric material and the blanket film of dielectric material are different dielectric materials in order to retain a high degree of selectivity during etching processes associated with removing the supporting dielectric material during manufacturing. A carrier is bonded above the blanket dielectric material in order to handle the transistors during the process of trimming the substrate to provide a mask for trimming the transistors.

In operation 502, subsequent to bonding the carrier to the blanket dielectric material, the substrate is inverted and a patterning an etch process is undertaken to form substrate segments (see substrate segment 408A and substrate segment 408B in FIG. 4A). By patterning and etching the substrate to form substrate segments, each substrate segment acts as a hard mask for an anisotropic etch process which eliminates excess source electrode material extending beyond the edges of the substrate segments. Thus, the dimensions of the substrate segment act as a mask for determining dimensions of transistors both above and below the substrate segment in the semiconductor device.

Method 500 includes an operation 503 wherein a second transistor is manufactured below the substrate. In FIGS. 4C and 4D, described above, a semiconductor device 400 undergoes manufacturing processes consistent with operation 503, as described herein.

In operation 503, subsequent to forming openings in the substrate and trimming the substrate to have substrate segments directly connected to the transistors on the first side of the substrate, and anisotropic etch process is performed in order to reduce a lateral dimension of transistors such that the width of the transistor corresponds to the width of the substrate segment. Further etch process is performed in order to etch through the blanket dielectric material and form dielectric material segments at a top side of the transistor between the transistor and the carrier. A support material is deposited against the carrier and the sides of the dielectric material segments, the size of transistors, and the sides of the substrate segments in order to support these elements and prevent contamination during manufacture of transistors on the bottom side of the substrate segments, opposite from the transistors on the top sides of the substrate segments.

In operation 503, the second transistor is manufactured on a bottom side of the substrate segment. Manufacturing the second substrate is performed in a manner similar to the description provided above for the first transistor in operation 502. A support material is deposited between and around the second transistor on the bottom side of this substrate segment, and a blanket layer of hard mask material is deposited along the bottom side of the second transistor and against the support material between and around the second transistors. According to some embodiments, the support material deposited between and around the second transistors is the same support material deposited between and around the transistors at the top of the substrate segment. According to some embodiments, the support material is silicon dioxide or another dielectric material deposited by, e.g., chemical vapor deposition (CVD) or plasma vapor deposition (PVD). According to some embodiments, the hard mask material deposited against the bottom of the second transistors and side of the substrate segments is a layer of silicon, silicon nitride, or silicon carbide deposited by, e.g., epitaxial growth process or an atomic layer deposition. The carrier is bonded to the bottom side of the transistor stack and the first carrier is removed from the top of the dielectric material segments at the top end of the transistors of the top of the substrate segments.

An anisotropic etch process is performed wherein the dielectric material segments at the top side of the top transistors served as heart masks to protect the first transistors, and the substrate segments between transistors serve as a hard mask to define a lateral dimension of the bottom transistors such that the top and bottom transistors have the same lateral dimension, and a subsequent etch process trims the blanket hard mask material into hard mask segments which have the same lateral dimension as the top transistor, the substrate segment, and the bottom transistor. The subsequent etch process which trims the blanket hard mask material also exposes the carrier at the bottom of the bottom transistors.

Method 500 includes an operation 504 wherein spacer material is deposited against transistor sidewalls. In FIG. 4E, described above, a semiconductor device 400 undergoes manufacturing processes consistent with operation 504, as described herein.

In operation 504, a spacer material is deposited along the sides of hard mask segments, the bottom transistors, the substrate segments, the top transistors, and the dielectric material segments. Thus, substrate material extends from the bottom carrier up to the top of the transistor stack. According to some embodiments, a substrate material includes silicon nitride, silicon oxide nitride, or some other inorganic material which electrically isolates the transistors from adjacent electrically active components and has a different etch rate (e.g., low or high selectivity, according to some embodiments) with regard to other dielectric material such as silicon dioxide. In some embodiments of operation 504, an anisotropic etch process is performed in order to remove space material from the top surface of the dielectric material segments and from a majority of the horizontal surface of the bottom carrier between adjacent transistors in the semiconductor device. According to some embodiments, spacer material forms isolated spacer material segments, or spacer segments, along opposite sides of a transistor active area. According to some embodiments, spacer material forms a continuous material along a perimeter of a transistor, and the space material is artificially designated into segments based on whether the material is on one side or the other side of the perimeter of the transistor along the major axis of the transistor.

Method 500 includes an operation 506, wherein electrical connections are manufactured at a top side of the first transistor. In FIGS. 4F-4J, semiconductor device 400 undergoes manufacturing processes consistent with performing operation 506, as described herein.

In operation 506, electrical connections are manufactured against the top side of the first transistor. As part of operation 506, the dielectric material segments at the top side of the top transistors are removed by, e.g., a selective wet etch process in order to expose the top surface of the transistors. A selective wet etch process, or a selective plasma etch process, allows for removal of dielectric material segments without damaging tops of transistors for rounding the corner or modifying the lateral dimensions of the spacer segments along the sidewalls of the transistor.

As part of operation 506, a dielectric material separate from the support material is deposited over a top surface of the top transistors and between and along outer sidewalls of the spacer segments (e.g., between spacer segments on adjacent transistors or adjacent transistor stacks). According to some embodiments, the dielectric material deposited during operation 506 is silicon dioxide or silicon oxide nitride deposited by a chemical vapor deposition process. In some embodiments, a chemical mechanical polishing (CMP) process is performed in order to expose an end of the spacer segments distal from the bottom carrier. A blanket hard mask layer is deposited over the distal ends of the substrate segments and dielectric material between the spacer segments and the dielectric material over the top sides of the top transistors layer of patterning material is deposited over the top surface of the hard mask and a pattern is transferred thereto with openings extending over the transistor stacks or top transistors. As a further part of operation 506, an etch process is performed in order to transfer the pattern in the layer of patterning material to the hard mask over the top transistors and the dielectric material.

In operation 506, subsequent to removing the layer of patterning material, an etch process is performed in which the portions of substrate segments distal from the bottom carrier and exposed by openings in the layer of hard mask material are recessed to a depth consistent with the top of the recessed segment being coplanar with the top surface of the top transistors. By performing a selective etch process to in some of the spacer segments, a lateral dimension of the transistor electrodes manufactured during method 500 is increased at specified locations in order to promote greater flexibility in developing a top-side interconnect structure for the semiconductor device.

As further part of operation 506, the layer of hard mask is removed from above the top transistors (e.g., from above the ends of the space material distal from the bottom carrier, exposing the dielectric material and the ends of the spacer segments distal from the bottom carrier. An etch process is performed to remove the dielectric material directly over the top transistors, leaving the spacer segments unmodified with regards to lateral dimension or vertical dimension above the top of the top transistors. According to some embodiments, a dilute hydrofluoric acid etch process is able to remove the dielectric material selectively with regard to the spacer material, and to expose the top surface of the top transistors. As further part of operation 506, the process of removing the dielectric material directly over the top transistors also recesses the dielectric material between spacer segments on sidewalls of the adjacent transistors (e.g., in the region where the soft line interconnect structure is manufactured, see, e.g., operation 510, below).

As part of operation 506, the conductive material is deposited directly over the top surface of the top transistors, the top surface of the exposed dielectric material between adjacent transistors, or between facing spacer segments (see, e.g., spacer segment 28B and spacer segment 428C in FIG. 4J), and over the top surfaces of the spacer segments. According to some embodiments, a CMP process is performed in order to expose the ends of the spacer segments distal from the bottom carrier and electrically isolate the transistor electrodes and interconnect electrode thus manufactured by the deposition process. According to some embodiments, the transistor electrodes and interconnect electrode independently include a conductive material such as cobalt, tungsten, tantalum, titanium, platinum, palladium, copper, or some other conductive material suitable for an electrical interconnect in proximity to a gate-all-around (GAA) transistor. According to some embodiments, the amount to which the exposed spacer segment is reduced corresponds to the vertical dimension of the transistor electrodes across multiple transistor, and to the vertical dimension of the interconnect electrode between transistors, or between facing spacer segments as described above with regard to FIG. 4J.

Method 500 includes an operation 508, wherein a first interconnect structure is manufactured at an opposite side of the first transistor from the substrate. In FIG. 4K, semiconductor device 400 undergoes manufacturing processes consistent with performing operation 508, as described herein.

According to some embodiments, a first layer of a top interconnect structure is manufactured with electrical connections to one or more of the transistor electrodes, and/or the interconnect electrodes manufactured in operation 506, as described above. A first layer of a top interconnect structure includes power rails (e.g., a Vss and/or a Vdd power rail, conductive lines to and from transistors, and contacts between the power rails and/or conductive lines, and the transistor electrodes or interconnect electrodes. In some embodiments, the contacts are manufactured by performing patterning and etch processes and depositing layers of liner materials (e.g., TiN, TaN, and so forth) and conductive materials (Co, Ti, Ta, Cu, and so forth) into the openings.

Method 500 includes an operation 510, wherein a self-aligned interconnect structure (SIS) is manufactured in proximity to the spacer material. In FIGS. 4L-4N, semiconductor device 400 undergoes manufacturing processes consistent with performing operation 510, as described herein.

According to some embodiments of operation 510, a self-aligned interconnect structure (SIS) is manufactured by first, bonding a top carrier above one or more layers of the top interconnect structure for the semiconductor device, and removing the bottom carrier from below the bottom transistors. According to some embodiments, a second hard mask material is deposited against the bottom surface of the hard mask segments below the bottom transistors, and a second layer of patterning material is deposited in proximity to the second hard mask material. According to some embodiments, the second hard mask material includes a same composition as the hard mask segments the bottom side of the bottom transistors. According to some embodiments, the second hard mask material is a different material than the hard mask segments of the bottom of the bottom transistors. In some embodiments, the second hard mask material layer of silicon, silicon nitride, silicon oxy-nitride, or silicon carbide deposited by an epitaxial process for a CVD process.

A pattern is transferred to the second layer of patterning material wherein are applications which correspond to locations of self-aligned interconnect structures in the semiconductor device. An etch process is performed in order to extend the openings in the second layer of patterning material into the second hard mask material below the bottom transistors, exposing an end of the dielectric material distal from the first layer of the top interconnect structure.

In operation 510, once the opening has been extended through the second hard mask material to expose the bottom end of the dielectric material in the location of the SIS, the second layer of patterning material is removed, and an etch process is performed to remove the dielectric material and expose a bottom surface of interconnect structure at an end proximal to the first layer of the top interconnect structure. According to some embodiments, the etch process for selectively removing the dielectric material comprises a wet process having dilute hydrofluoric acid which preferentially targets silicon dioxide leaving the spacer material or spacer segments largely unmodified.

In operation 510, once the bottom side of the interconnect electrode has been exposed by the selective etch process, an interconnect material is deposited into the opening between the spacer segments and adjacent to the transistor electrode. According to some embodiments, the interconnect material is a semiconductor material deposited by an epitaxial process or an atomic layer deposition process. In some embodiments, the interconnect material is a conductive material comprising, e.g., cobalt, tungsten, titanium, or tantalum, and so forth, deposited by a sputtering or metal diffusion process. According to some embodiments, once the interconnect material has been deposited, a planarization process or etch process is performed in order to remove interconnect material from the surface of the second hard mask, and expose the ends of the substrate segments distal from the first layer of top interconnect structure. In some embodiments, the CMP process removes the interconnect material and the second hard mask to expose the hard mask segments at the bottom side of the bottom transistors.

Method 500 includes an operation 512, wherein electrical connections are manufactured against the second transistor. In FIGS. 4O-4R, semiconductor device 400 undergoes manufacturing processes consistent with performing operation 512.

In operation 512, a third hard mask is deposited a bottom side of the hard mask segments below the bottom transistors in the layer of patterning material is deposited thereon. The patterning process is performed in order to transfer the pattern to the layer of patterning materials, and openings in the pattern correspond to locations for transistor electrodes in semiconductor device. An etch process is performed in order to selectively etch the third hard mask material while leaving the material of the hard mask segments at the bottom of the bottom transistors unmodified. In some embodiments, the etch process is performed using a liquid etch which is selective to the material of the third hard mask, while leaving material of the hard mask segments unmodified. According to some embodiments, the etch process is a plasma etch which stops when a and end point is detected upon transitioning from etching the third hard mask material to the material of the hard mask segments a bottom of the bottom transistors, or upon exposing any of the spacer material at the bottom end of the transistor stacks the semiconductor device (see semiconductor device 400 in FIG. 4O and FIG. 4P.)

Subsequent exposing the bottom ends of the spacer segments, the layer of patterning material is removed from the semiconductor device by, e.g., and etching step, and an etch process is performed in order to selectively recess spacer material exposed within the openings in the third hard mask at the bottom of the transistor stack. In some embodiments, the spacer material is recessed such that the end of the spacer segment is approximately coplanar with the bottom surface of the bottom transistors. In some embodiments, the space material is recessed such that a sidewall of the bottom transistor is exposed once the spacer segment has been recessed.

Subsequent to recessing the spacer segment (see, e.g., semiconductor device 400 in FIG. 4Q), the third hard mask material and the hard mask segments at the bottom end of the bottom transistors are removed leaving behind exposed ends of the spacer segments distal from the first layer of the top interconnect structure, and the bottom surfaces of the bottom transistors. The conductive material is deposited into the opening thus formed at the bottom ends of the bottom transistors, and a CMP process is performed in order to eliminate excess conductive material and expose the bottom ends of the spacer segments, electrically isolating the transistor electrodes thus formed from other circuit elements in the semiconductor device (see, e.g., semiconductor device 400 in FIG. 4R).

Method 500 includes an operation 513, wherein a second interconnect structure is manufactured against the second transistor. In FIG. 4R, semiconductor device 400 undergoes manufacturing processes consistent with performing operation 513. In operation 513, and second interconnect structure (e.g., a bottom interconnect structure) is manufactured in proximity to the transistor electrodes manufactured in operation 512 at the bottom side of the bottom transistors manufactured in operation 503, as described above.

Figure 6A:
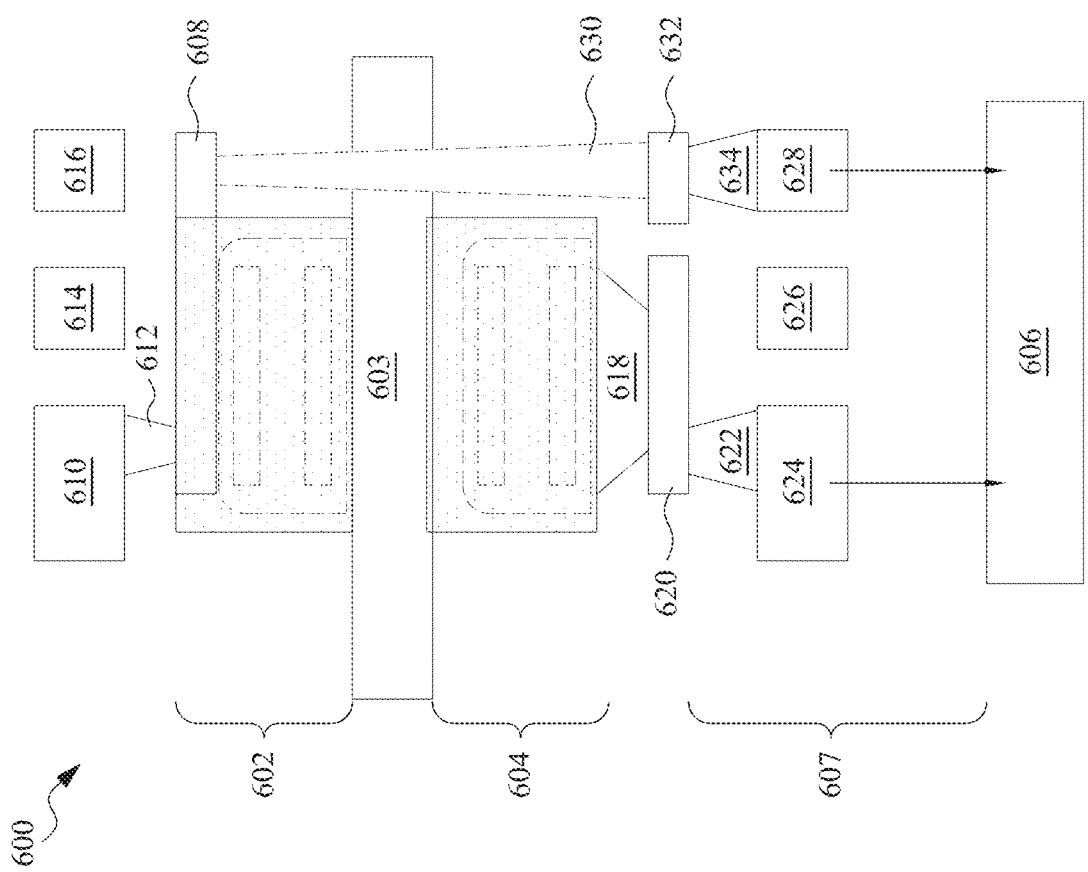
FIG. 6A is a cross-sectional view of a semiconductor device, in accordance with some embodiments.

FIG. 6A is a cross-sectional view of a semiconductor device 600, in accordance with some embodiments.

In FIG. 6A, semiconductor device 600 includes a power interconnect 630 which electrically connects a transistor electrode 608 for a transistor 602 at a top side of the substrate 603 to a bottom interconnect structure 607 and a backside power pad 606. In semiconductor device 600, transistor 602 is on a top side of a substrate 603, and transistor 604 is on a bottom side of the substrate 603. Backside power pad 606 is electrically connected to the bottom interconnect structure 607. In bottom interconnect structure 607, power rail 624 is a VSS power rail that is electrically connected through contact 622, conductive line segment 620, and contact 618, to bottom transistor 604.

In semiconductor devices 600, power rail 610 is a VDD power rail and conductive line 628 in bottom interconnect structure 607 is a VDD-connected conductive line. Conductive lines 614 and 616 extend through the interconnect structure parallel to power rail 610. Power rail 610 electrically connects to VDD-connected conductive line 628 through contact 612, transistor electrode (source electrode) 608, SIS 630, conductive line segment 632, and contact 634. SIS 630 extends through substrate 603 in proximity to transistor 602 and transistor 604. In semiconductor device 600, the use of a SIS 630 reduces the amount of parasitic capacitance and resistance experienced during power delivery by shortening a path between the power pad and power rails or conductive lines electrically connected to voltage sources in comparison with other approaches that do not include SIS 630. The SIS 630 which extends through substrate 603 in semiconductor device 600 reduces the area of the semiconductor device 600 dedicated to power pickup cells and reduces the density of power pickup cells in a transistor to approximately every 20 poly pitch lines. The reduced number of power pickup cells permits an overall size of the semiconductor device 600 to be reduced.

Figure 6B:
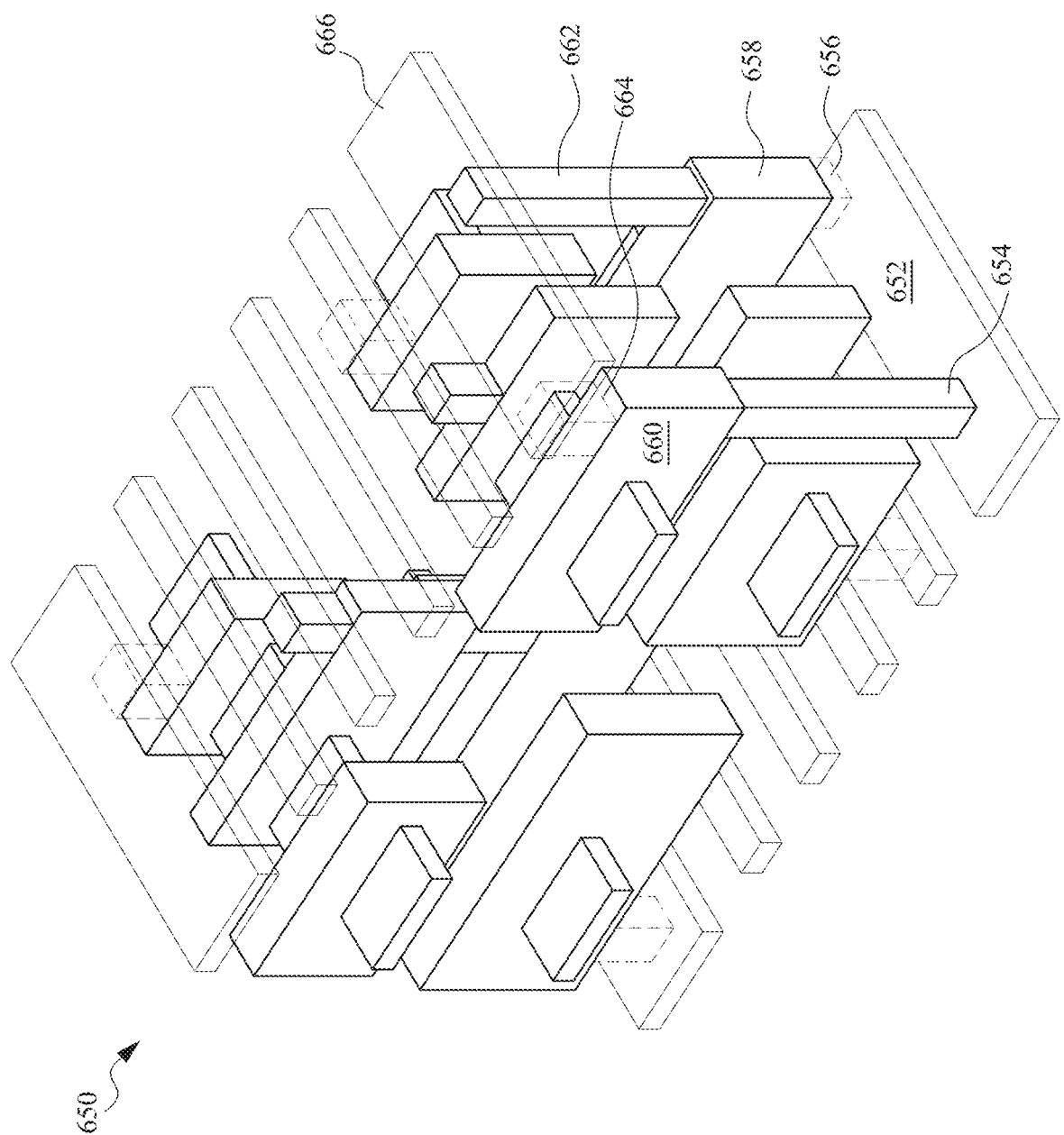
FIG. 6B is a perspective view of a semiconductor device, in accordance with some embodiments.

FIG. 6B is a perspective view of a semiconductor device 650, in accordance with some embodiments.

In FIG. 6B, semiconductor device 650 includes a bottom power rail 652 electrically connected to a top power rail 666. Bottom power rail 652 and top power rail 666 are electrically connected in parallel by a first conductive path through SIS 654, transistor electrode 660, and contact 664, and a second conductive path through contact 656, transistor electrode 658, and SIS 662. In some embodiments, power rail 652 and power rail 666 are VDD power rails. In some embodiments, power rail 652 and power rail 666 are VSS power rails. In semiconductor devices which employ high-density SIS, tap cells to access power are able to be reduced or completely eliminated in order to further reduce the die area of the semiconductor device.

Figure 7:
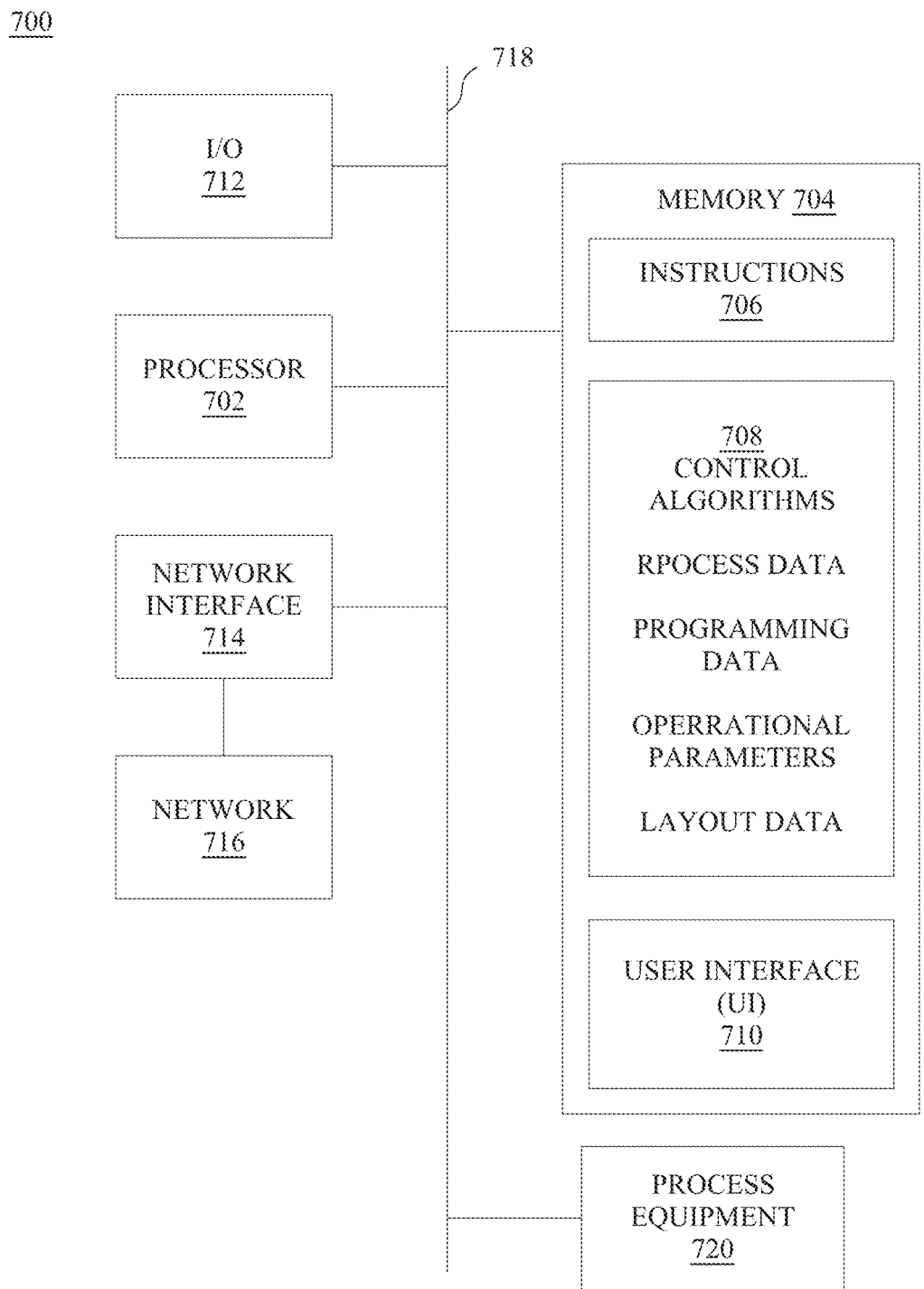
FIG. 7 is a block diagram of an electronic process control (EPC) system, in accordance with some embodiments.

FIG. 7 is a block diagram of an electronic process control (EPC) system 700, in accordance with some embodiments. Methods used for generating cell layout diagrams corresponding to some embodiments of the GAA structures detailed above, for example, using EPC system 700, in accordance with some embodiments of such systems. In some embodiments, EPC system 700 is a general-purpose computing device including a hardware processor 702 and a non-transitory, computer-readable, storage medium 704. Computer-readable storage medium 704, amongst other things, is encoded with, i.e., stores, computer program code (or instructions) 706, i.e., a set of executable instructions.

Execution of computer program code 706 by hardware processor 702 represents (at least in part) an EPC tool which implements at least a portion of the methods described herein in accordance with one or more of the structures and methods detailed herein.

Hardware processor 702 is electrically coupled to computer-readable storage medium 704 via a bus 718. Hardware processor 702 is also electrically coupled to an I/O interface 712 by bus 718. A network interface 714 is also electrically connected to hardware processor 702 via bus 718. Network interface 714 is connected to a network 716, so that both the hardware processor 702 and the computer-readable storage medium 704 can connect to external elements via network 716. Hardware processor 702 is configured to execute computer program code 706 encoded in computer-readable storage medium 704 to cause EPC system 700 to be usable for performing at least a portion of the noted processes and/or methods. In one or more embodiments, hardware processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, computer-readable storage medium 704 stores computer program code 706 configured to cause the EPC system 700 (where such execution represents (at least in part) the EPC tool) to be usable for performing a portion or all of the noted processes and/or methods. In one or more embodiments, computer-readable storage medium 704 also stores information which facilitates performing a portion or all of the noted processes and/or methods. In one or more embodiments, computer-readable storage medium 704 stores process control data 708 including, in some embodiments, control algorithms, process variables and constants, target ranges, set points, programming control data, and code for enabling statistical process control (SPC) and/or model predictive control (MPC) based control of the various processes.

EPC system 700 includes I/O interface 712. I/O interface 712 is coupled to external circuitry. In one or more embodiments, I/O interface 712 includes a keyboard, keypad, mouse, trackball, trackpad, touchscreen, and/or cursor direction keys for communicating information and commands to hardware processor 702.

EPC system 700 also includes network interface 714 coupled to hardware processor 702. Network interface 714 allows EPC system 700 to communicate with network 716, to which one or more other computer systems are connected. Network interface 714 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EPC systems 700.

EPC system 700 is configured to send information to and receive information from fabrication tools 720 that include one or more of ion implant tools, etching tools, deposition tools, coating tools, rinsing tools, cleaning tools, chemical-mechanical planarizing (CMP) tools, testing tools, inspection tools, transport system tools, and thermal processing tools that will perform a predetermined series of manufacturing operations to produce the desired integrated circuit devices. The information includes one or more of operational data, parametric data, test data, and functional data used for controlling, monitoring, and/or evaluating the execution, progress, and/or completion of the specific manufacturing process. The process tool information is stored in and/or retrieved from computer-readable storage medium 704.

EPC system 700 is configured to receive information through I/O interface 712. The information received through I/O interface 712 includes one or more of instructions, data, programming data, design rules that specify, e.g., layer thicknesses, spacing distances, structure and layer resistivity, and feature sizes, process performance histories, target ranges, set points, and/or other parameters for processing by hardware processor 702. The information is transferred to hardware processor 702 via bus 718. EPC system 700 is configured to receive information related to a user interface (UI) through I/O interface 712. The information is stored in computer-readable medium 704 as user interface (UI) 710.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EPC tool. In some embodiments, a portion or all of the noted processes and/or methods is implemented as a software application that is used by EPC system 700.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
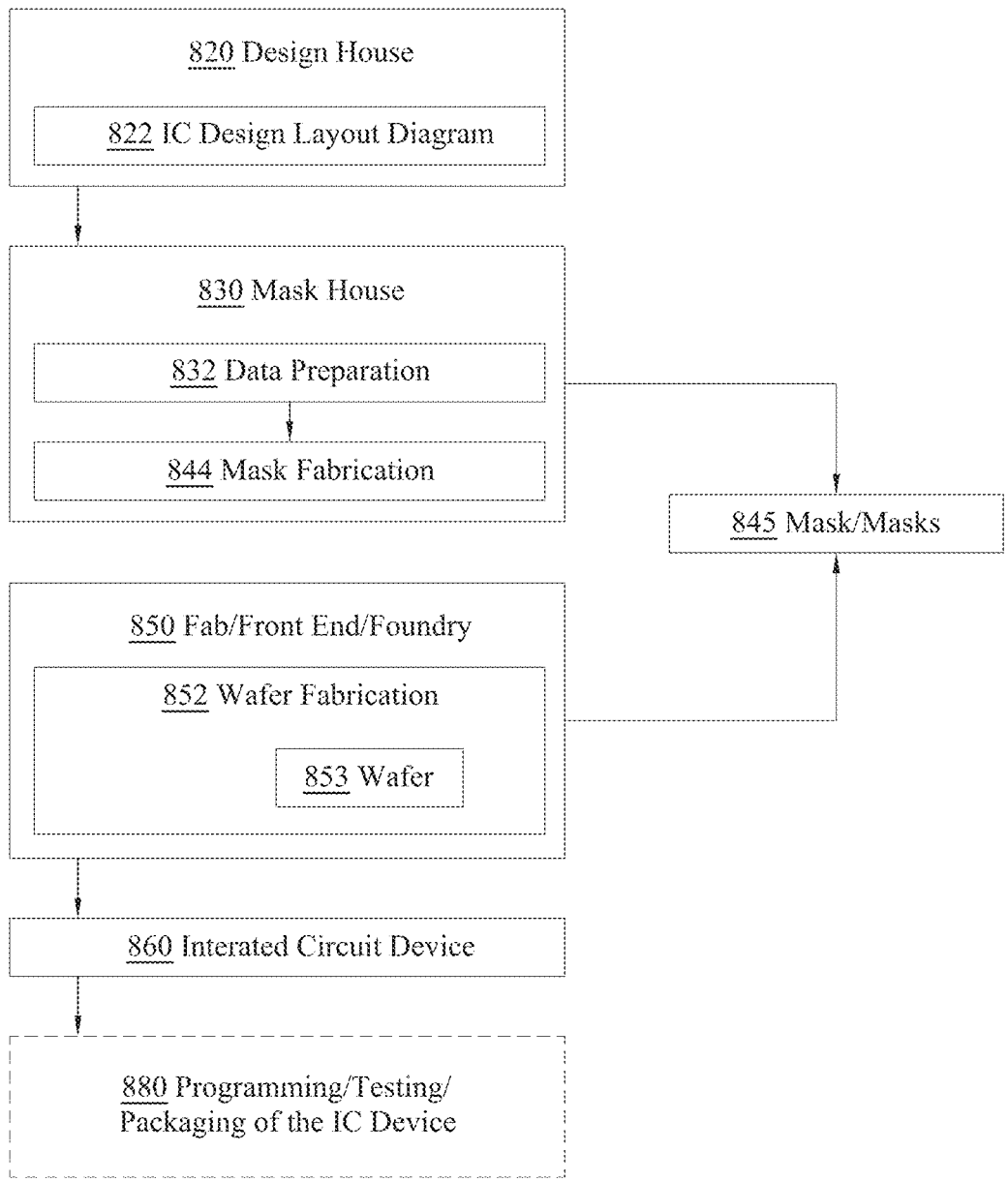
FIG. 8 is a block diagram of an integrated circuit (IC) manufacturing system, and an IC manufacturing flow associated therewith, in accordance with some embodiments.

FIG. 8 is a block diagram of an integrated circuit (IC) manufacturing system 800, and an IC manufacturing flow associated therewith, in accordance with some embodiments for manufacturing IC devices. In some embodiments, based on a layout diagram, at least one of (A) one or more semiconductor masks or (B) at least one component in a layer of a semiconductor integrated circuit is fabricated using manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. Once the manufacturing process has been completed to form a plurality of IC devices on a wafer, the wafer is optionally sent to backend or back end of line (BEOL) 880 for, depending on the device, programming, electrical testing, and packaging in order to obtain the final IC device products. The entities in manufacturing system 800 are connected by a communications network. In some embodiments, the communications network is a single network. In some embodiments, the communications network is a variety of different networks, such as an intranet and the Internet.

The communications network includes wired and/or wireless communication channels. Each entity interacts with one or more of the other entities and provides services to and/or receives services from one or more of the other entities. In some embodiments, two or more of design house 820, mask house 830, and IC Fab 850 are owned by a single larger company. In some embodiments, two or more of design house 820, mask house 830, and IC Fab 850 coexist in a common facility and use common resources.

Design house (or design team) 820 generates an IC design layout diagram 822. IC design layout diagram 822 includes various geometrical patterns designed for an IC device 860. The geometrical patterns correspond to patterns of metal, oxide, or semiconductor layers that make up the various components of IC device 860 to be fabricated. The various layers combine to form various IC features.

For example, a portion of IC design layout diagram 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout diagram 822. The design procedure includes one or more of logic design, physical design or place and route. IC design layout diagram 822 is presented in one or more data files having information of the geometrical patterns. For example, IC design layout diagram 822 can be expressed in a GDSII file format or DFII file format.

Whereas the pattern of a modified IC design layout diagram is adjusted by an appropriate method in order to, for example, reduce parasitic capacitance of the integrated circuit as compared to an unmodified IC design layout diagram, the modified IC design layout diagram reflects the results of changing positions of conductive line in the layout diagram, and, in some embodiments, inserting to the IC design layout diagram, features associated with capacitive isolation structures to further reduce parasitic capacitance, as compared to IC structures having the modified IC design layout diagram without features for forming capacitive isolation structures located therein.

Mask house 830 includes mask data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file ("RDF"). Mask data preparation 832 provides the RDF to mask fabrication 844. Mask fabrication 844 includes a mask writer. A mask writer converts the RDF to an image on a substrate, such as a mask (reticle) 845 or a semiconductor wafer 853. The IC design layout diagram 822 is manipulated by mask data preparation 832 to comply with particular characteristics of the mask writer and/or requirements of IC Fab 850. In FIG. 8, mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC Fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are repeated to further refine IC design layout diagram 822.

It should be understood that the above description of mask data preparation 832 has been simplified for the purposes of clarity. In some embodiments, mask data preparation 832 includes additional features such as a logic operation (LOP) to modify the IC design layout diagram 822 according to manufacturing rules. Additionally, the processes applied to IC design layout diagram 822 during mask data preparation 832 may be executed in a variety of different orders. After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask (photomask or reticle) 845 based on the modified IC design layout diagram 822. Mask 845 can be formed in various technologies. In some embodiments, mask 845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask.

In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes. IC Fab 850 includes wafer fabrication 852. IC Fab 850 is an IC fabrication business that includes one or more manufacturing facilities for the fabrication of a variety of different IC products. In some embodiments, IC Fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

Wafer fabrication 852 includes forming a patterned layer of mask material formed on a semiconductor substrate is made of a mask material that includes one or more layers of photoresist, polyimide, silicon oxide, silicon nitride (e.g., $Si_3N_4$, SiON, SiC, SiOC), or combinations thereof. In some embodiments, masks 845 include a single layer of mask material. In some embodiments, a mask 845 includes multiple layers of mask materials.

In some embodiments, the mask material is patterned by exposure to an illumination source. In some embodiments, the illumination source is an electron beam source. In some embodiments, the illumination source is a lamp that emits light. In some embodiments, the light is ultraviolet light. In some embodiments, the light is visible light. In some embodiments, the light is infrared light. In some embodiments, the illumination source emits a combination of different (UV, visible, and/or infrared) light.

Subsequent to mask patterning operations, areas not covered by the mask, e.g., fins in open areas of the pattern, are etched to modify a dimension of one or more structures within the exposed area(s). In some embodiments, the etching is performed with plasma etching, or with a liquid chemical etch solution, according to some embodiments. The chemistry of the liquid chemical etch solution includes one or more of etchants such as citric acid ($C_6H_8O_7$), hydrogen peroxide ($H_2O_2$), nitric acid ($HNO_3$), sulfuric acid ($H_2SO_4$), hydrochloric acid (HCl), acetic acid ($CH_3CO_2H$), hydrofluoric acid (HF), buffered hydrofluoric acid (BHF), phosphoric acid ($H_3PO_4$), ammonium fluoride ($NH_4F$) potassium hydroxide (KOH), ethylenediamine pyrocatechol (EDP), TMAH (tetramethylammonium hydroxide), or a combination thereof.

In some embodiments, the etching process is a dry-etch or plasma etch process. Plasma etching of a substrate material is performed using halogen-containing reactive gases excited by an electromagnetic field to dissociate into ions. Reactive or etchant gases include, for example, $CF_4$, $SF_6$, $NF_3$, $Cl_2$, $CCl_2F_2$, $SiCl_4$, $BCl_2$, or a combination thereof, although other semiconductor-material etchant gases are also envisioned within the scope of the present disclosure. Ions are accelerated to strike exposed material by alternating electromagnetic fields or by fixed bias according to methods of plasma etching that are known in the art.

In some embodiments, etching processes include presenting the exposed structures in the functional area(s) in an oxygen-containing atmosphere to oxidize an outer portion of the exposed structures, followed by a chemical trimming process such as plasma-etching or liquid chemical etching, as described above, to remove the oxidized material and leave behind a modified structure. In some embodiments, oxidation followed by chemical trimming is performed to provide greater dimensional selectivity to the exposed material and to reduce a likelihood of accidental material removal during a manufacturing process. In some embodiments, the exposed structures include the nanosheets and/or gate structures of Gate All Around (GAA) devices with the gate structures being embedded in a dielectric support medium covering the sides of the gate structures. In some embodiments, the exposed portions of the gate structures of the functional area are top surfaces and sides of the gate structures that are above a top surface of the dielectric support medium, where the top surface of the dielectric support medium has been recessed to a level below the top surface of the nanosheet stacks, but still covering a lower portion of the nanosheet stacks.

IC Fab 850 uses mask(s) 845 fabricated by mask house 830 to fabricate IC device 860. Thus, IC Fab 850 at least indirectly uses IC design layout diagram 822 to fabricate IC device 860. In some embodiments, semiconductor wafer 853 is fabricated by IC Fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multilevel interconnects, and the like (formed at subsequent manufacturing steps).

Figure 9:
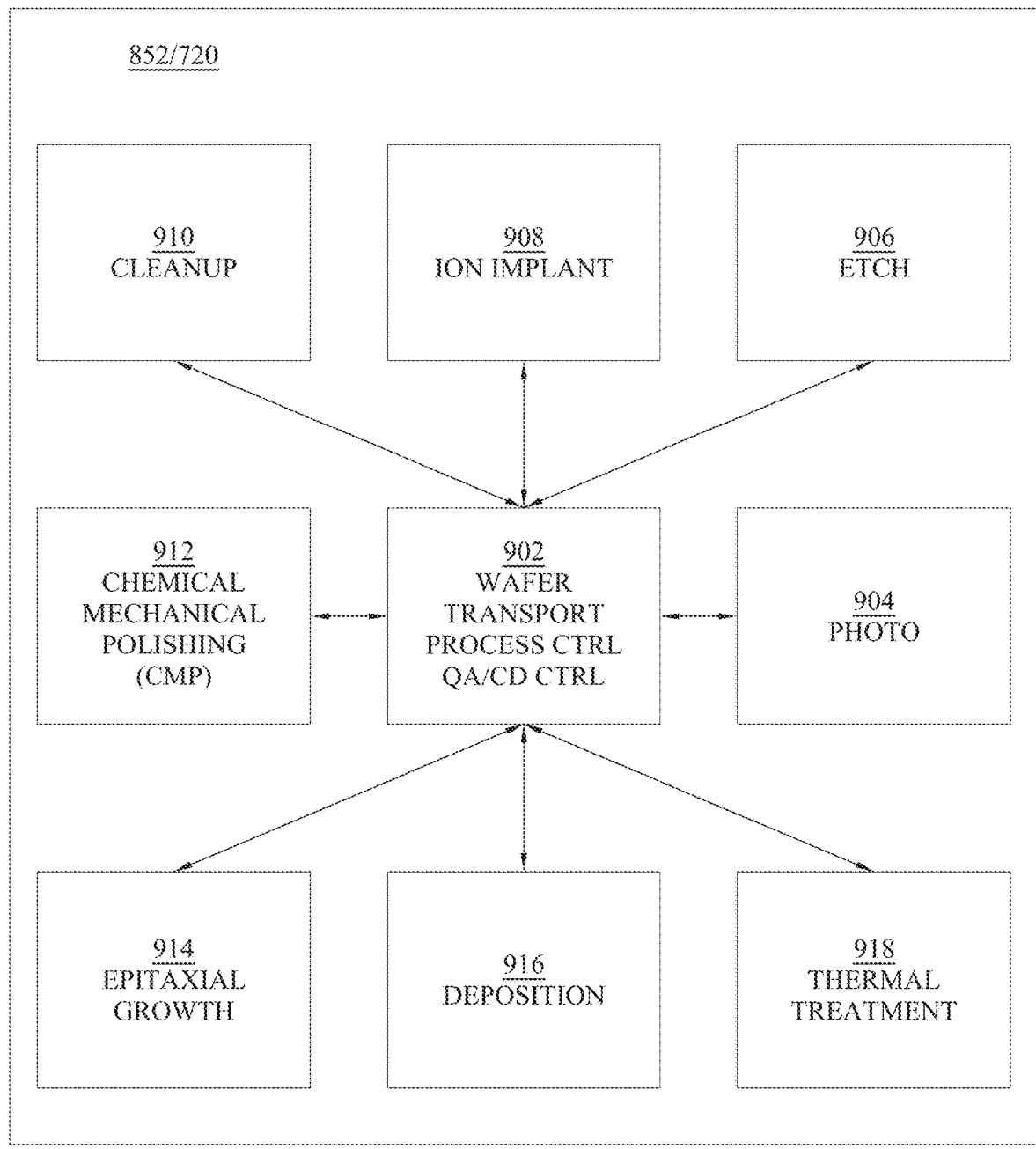
FIG. 9 is a schematic diagram of various processing departments defined within a Fab/Front End/Foundry for manufacturing IC devices according to some embodiments.

FIG. 9 is a schematic diagram of various processing departments defined within a Fab/Front End/Foundry for manufacturing IC devices according to some embodiments as suggested in FIG. 7, specifically in blocks 708 and 720 and FIG. 8, specifically in block 850. The processing departments utilized in front end of line (FEOL) IC device manufacturing typically include a wafer transport operation 902 for moving the wafers between the various processing departments. In some embodiments, the wafer transport operation will be integrated with an electronic process control (EPC) system according to FIG. 10 and utilized for providing process control operations, ensuring that the wafers being both processed in a timely manner and sequentially delivered to the appropriate processing departments as determined by the process flow. In some embodiments, the EPC system will also provide control and/or quality assurance and parametric data for the proper operation of the defined processing equipment. Interconnected by the wafer transport operation 902 will be the various processing departments providing, for example, photolithographic operations 904, etch operations 906, ion implant operations 908, clean-up/strip operations 910, chemical mechanical polishing (CMP) operations 912, epitaxial growth operations 914, deposition operations 916, and thermal treatments 918.

Additional details regarding integrated circuit (IC) manufacturing systems and an IC manufacturing flows associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, each of which are hereby incorporated, in their entireties, by reference.

An aspect of this description relates to a method of making a semiconductor device. The method includes manufacturing a first transistor over a first side of a substrate. The method further includes depositing a spacer material against a sidewall of the first transistor. The method further includes recessing the spacer material to expose a first portion of the sidewall of the first transistor. The method further includes manufacturing a first electrical connection to the transistor, a first portion of the electrical connection contacts a surface of the first transistor farthest from the substrate, and a second portion of the electrical connect contacts the first portion of the sidewall of the first transistor. The method further includes manufacturing a self-aligned interconnect structure (SIS) extending along the spacer material, wherein the spacer material separates a portion of the SIS from the first transistor, and the first electrical connection directly contacts the SIS. In some embodiments, the method further includes electrically connecting the SIS to a power rail. In some embodiments, the method further includes electrically connecting the SIS to a conductive line of an interconnect structure. In some embodiments, the method further includes manufacturing the interconnect structure on a second side of the substrate opposite to the first side of the substrate. In some embodiments, manufacturing the SIS includes etching an opening in the substrate; and depositing a conductive material in the opening in the substrate. In some embodiments, manufacturing the SIS includes manufacturing the SIS having a uniform width. In some embodiments, manufacturing the SIS includes manufacturing the SIS having a tapered profile.

An aspect of this description relates to a method of making a semiconductor device. The method includes manufacturing a first transistor over a first side of a substrate. The method includes depositing a spacer material against a sidewall of the first transistor. The method includes recessing the spacer material to expose a first portion of the sidewall of the first transistor. The method includes manufacturing a first electrical connection to the transistor, a first portion of the electrical connection contacts a surface of the first transistor farthest from the substrate, and a second portion of the electrical connect contacts the first portion of the sidewall of the first transistor. The method includes manufacturing a self-aligned interconnect structure (SIS) extending through an entirety of the substrate in a thickness direction, wherein the spacer material separates a portion of the SIS from the first transistor, and the first electrical connection directly contacts the SIS. In some embodiments, manufacturing the first transistor includes manufacturing a gate all around (GAA) transistor. In some embodiments, the method further includes manufacturing a second transistor on a second side of the substrate, wherein the second side is opposite the first side. In some embodiments, depositing the spacer material includes depositing the spacer material against a sidewall of the second transistor. In some embodiments, manufacturing the SIS includes manufacturing the SIS separated from the second transistor by the spacer material. In some embodiments, the method further includes manufacturing a second transistor on the first side of the substrate. In some embodiments, manufacturing the SIS includes manufacturing the SIS between the first transistor and the second transistor. In some embodiments, manufacturing the SIS includes manufacturing the SIS electrically separated from the second transistor.

An aspect of this description relates to a method of making a semiconductor device. The method includes manufacturing a first transistor on a first side of a substrate. The method further includes manufacturing a second transistor on a second side of the substrate, opposite the first side. The method further includes etching the first transistor and the second transistor to define a first sidewall of the first transistor aligned with a second sidewall of the second transistor. The method further includes depositing a spacer material against the first sidewall and against the second sidewall. The method further includes exposing an end surface of the second transistor farthest from the substrate. The method further includes depositing an electrode material over the exposed end surface of the second transistor. The method further includes manufacturing a self-aligned interconnect structure (SIS) extending through an entirety of the substrate in a thickness direction, wherein the spacer material separates a portion of the SIS from the first transistor and from the second transistor, and an end surface of the SIS on the second side of the substrate is coplanar with the end surface of the second transistor. In some embodiments, the method further includes recessing the spacer material to expose a first portion of the sidewall of the first transistor. In some embodiments, the method further includes manufacturing a first electrical connection to the first transistor, a first portion of the electrical connection contacts a surface of the first transistor farthest from the substrate, and a second portion of the electrical connect contacts the first portion of the sidewall of the first transistor. In some embodiments, manufacturing the SIS includes directly contacting the SIS to the first electrical connection. In some embodiments, manufacturing the SIS includes manufacturing the end surface of the SIS in direct contact with a conductive material, wherein the conductive material is deposited simultaneously with the electrode material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a semiconductor device, comprising:
   manufacturing a first transistor over a first side of a substrate;
   depositing a spacer material against a sidewall of the first transistor;
   recessing the spacer material to expose a first portion of the sidewall of the first transistor;
   manufacturing a first electrical connection to the transistor, a first portion of the first electrical connection contacts a surface of the first transistor farthest from the substrate, and a second portion of the first electrical connection contacts the first portion of the sidewall of the first transistor; and
   manufacturing a self-aligned interconnect structure (SIS) extending along the spacer material, wherein the spacer material separates a portion of the SIS from the first transistor, and the first electrical connection directly contacts the SIS.

2. The method of claim 1, further comprising electrically connecting the SIS to a power rail.

3. The method of claim 1, further comprising electrically connecting the SIS to a conductive line of an interconnect structure.

4. The method of claim 3, further comprising manufacturing the interconnect structure on a second side of the substrate opposite to the first side of the substrate.

5. The method of claim 1, wherein manufacturing the SIS comprises:
etching an opening in the substrate; and
depositing a conductive material in the opening in the substrate.

6. The method of claim 1, wherein manufacturing the SIS comprises manufacturing the SIS having a uniform width.

7. The method of claim 1, wherein manufacturing the SIS comprises manufacturing the SIS having a tapered profile.

8. A method of making a semiconductor device, comprising:
manufacturing a first transistor over a first side of a substrate;
depositing a spacer material against a sidewall of the first transistor;
recessing the spacer material to expose a first portion of the sidewall of the first transistor;
manufacturing a first electrical connection to the transistor, a first portion of the first electrical connection contacts a surface of the first transistor farthest from the substrate, and a second portion of the first electrical connection contacts the first portion of the sidewall of the first transistor; and
manufacturing a self-aligned interconnect structure (SIS) extending through an entirety of the substrate in a thickness direction, wherein the spacer material separates a portion of the SIS from the first transistor, the SIS extends along the spacer material, and the first electrical connection directly contacts the SIS.

9. The method of claim 8, wherein manufacturing the first transistor comprises manufacturing a gate all around (GAA) transistor.

10. The method of claim 8, further comprising manufacturing a second transistor on a second side of the substrate, wherein the second side is opposite the first side.

11. The method of claim 10, wherein depositing the spacer material comprises depositing the spacer material against a sidewall of the second transistor.

12. The method of claim 11, wherein manufacturing the SIS comprises manufacturing the SIS separated from the second transistor by the spacer material.

13. The method of claim 8, further comprising manufacturing a second transistor on the first side of the substrate.

14. The method of claim 13, wherein manufacturing the SIS comprises manufacturing the SIS between the first transistor and the second transistor.

15. The method of claim 13, wherein manufacturing the SIS comprises manufacturing the SIS electrically separated from the second transistor.

16. A method of making a semiconductor device, comprising:
manufacturing a first transistor over a first side of a substrate, wherein the first transistor comprises a gate all around (GAA) transistor;
depositing a spacer material against a sidewall of the first transistor;
recessing the spacer material to expose a first portion of the sidewall of the first transistor;
manufacturing a first electrical connection to the transistor, a first portion of the first electrical connection contacts a surface of the first transistor farthest from the substrate, and a second portion of the first electrical connection contacts the first portion of the sidewall of the first transistor; and
manufacturing a self-aligned interconnect structure (SIS) extending through an entirety of the substrate in a thickness direction, wherein the spacer material separates a portion of the SIS from the first transistor, and the first electrical connection directly contacts the SIS.

17. The method of claim 16, wherein manufacturing the SIS comprises manufacturing the SIS extends along the spacer material.

18. The method of claim 16, further comprising:
manufacturing a second transistor, wherein depositing the spacer material comprises depositing the spacer material along an entirety of a sidewall of the second transistor; and
maintaining the spacer material along the entirety of the sidewall of the second transistor during the method of making the semiconductor device.

19. The method of claim 18, wherein manufacturing the second transistor comprises manufacturing the second transistor over the first side of the substrate.

20. The method of claim 18, wherein manufacturing the second transistor comprises manufacturing the second transistor on a second side of the substrate opposite the first side of the substrate.

* * * * *